(12) United States Patent
Ortabasi

(10) Patent No.: US 6,252,155 B1
(45) Date of Patent: *Jun. 26, 2001

(54) SPACE CONCENTRATOR FOR ADVANCED SOLAR CELLS

(76) Inventor: Ugur Ortabasi, 1680 Meadowglen La., Encinitas, CA (US) 92024

( * ) Notice: Subject to any disclaimer, the term of this patent is extended or adjusted under 35 U.S.C. 154(b) by 0 days.

This patent is subject to a terminal disclaimer.

(21) Appl. No.: 09/552,536

(22) Filed: Apr. 19, 2000

Related U.S. Application Data

(62) Division of application No. 08/976,412, filed on Nov. 21, 1997, now Pat. No. 6,057,505.

(51) Int. Cl.[7] .................................................. H01L 25/00
(52) U.S. Cl. ............................................ 136/246; 359/853
(58) Field of Search ............................. 136/246; 359/853

(56) References Cited

U.S. PATENT DOCUMENTS

| | | | |
|---|---|---|---|
| 3,923,381 | 12/1975 | Winston | 350/293 |
| 4,114,592 | 9/1978 | Winston | 126/270 |
| 4,494,302 | 1/1985 | Knechtli et al. | 29/575 |
| 4,883,522 | 11/1989 | Hagerty et al. | 65/18.4 |
| 4,964,713 | 10/1990 | Goetzberger | 350/629 |
| 5,405,453 | 4/1995 | Ho et al. | 136/249 |
| 6,057,505 | * 5/2000 | Ortabasi | 136/146 |

OTHER PUBLICATIONS

W.T. Welford et al, "The Optics of Nonimaging Concentrators", Academic Press, Inc., pp. 77–79 (1978).

\* cited by examiner

*Primary Examiner*—Mark Chapman
(74) *Attorney, Agent, or Firm*—David W. Collins

(57) ABSTRACT

A solar concentrator is provided that comprises two stages. The first stage comprises either a trough-shaped concentrator cusp unit having two major opposed sides joined by two ends. The inner surfaces of the first stage concentrator are mirrored. Further, the ends have two flat, angled surfaces, while the two sides have a Bezier-generated cylindrical shape that approximate parabolic surfaces followed by a straight section. The second stage comprises a bi-axial gradient refractive index (GRIN) element, in which two gradient refractive index materials, each having a high index surface and a low index surface, are joined together along their high index surfaces. The two ends of the bi-axial element are flat, while the two sides also have a Bezier-generated cylindrical shape that approximate parabolic surfaces followed by a straight section. The top surface of the bi-axial element is provided with a cylindrical surface, while the bottom, or exit, surface is ground flat. The high index boundary is parallel to the side surfaces of the first stage unit. A solar cell is bonded to the flat exit surface of the second stage of the concentrator of the present invention. An array of such concentrators and solar cells, in which the solar cells are electrically interconnected, may then be deployed for converting solar energy into useful electrical energy. The 2-D/3-D concentrator evidences much lower mass than prior art concentrators. Further, as the array, or panel, of solar cells wobbles in space, the concentrator will continue to operate, even at lower efficiencies, due to the larger acceptance angle. Concentration ratios on the order of 50× are realized with the present concentrator. However, design studies allow concentration ratios in excess of 300× when used with 3-D versions of the same concept. The second stage can comprise mirrored surfaces. Or, the first stage can comprise a conical section and the second stage a radial GRIN element.

17 Claims, 20 Drawing Sheets

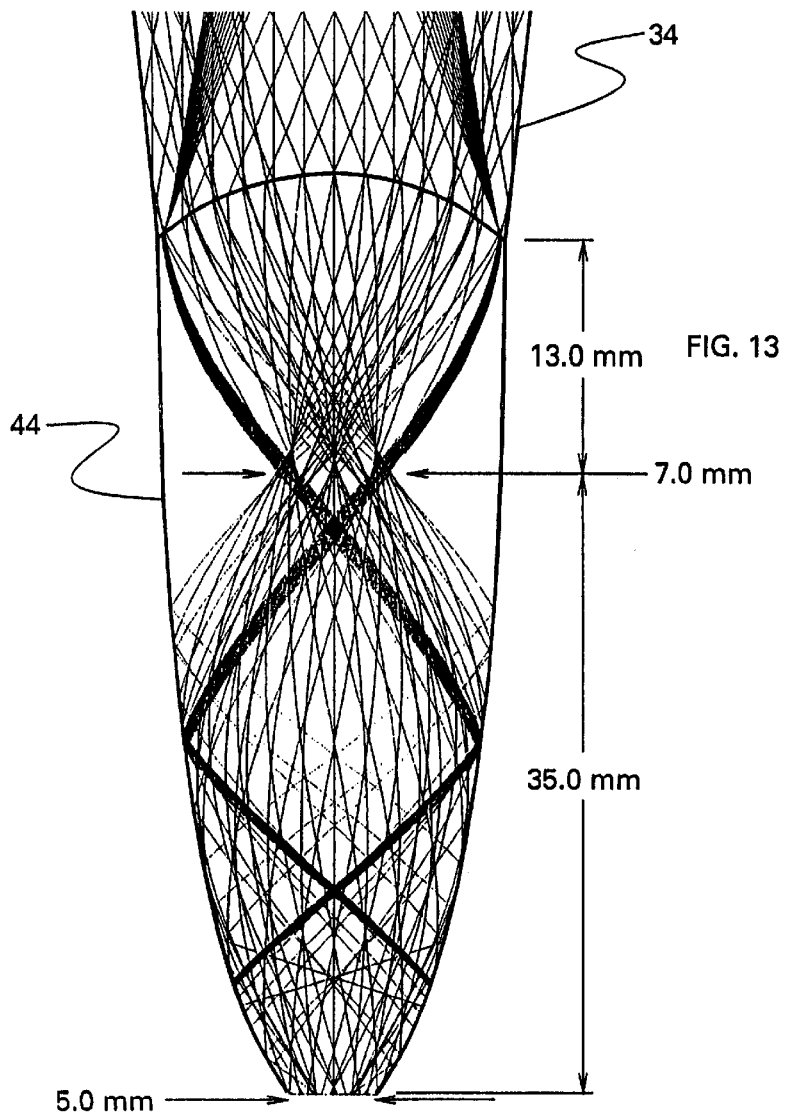
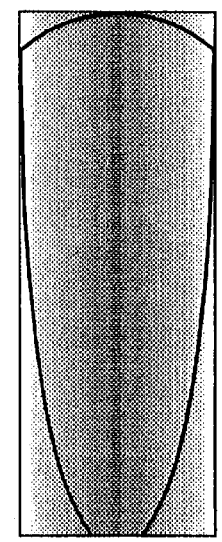
FIG. 13
FIG. 13a
FIG. 13

SPACE CONCENTRATOR FOR ADVANCED SOLAR CELLS

This application is a Division of Ser. No. 08/976,412 filed Nov. 21, 1997 now U.S. Pat. No. 6,057,505.

ORIGIN OF INVENTION

Part of this invention was made with support from the U.S. Government. The U.S. Government has certain rights in such part of this invention.

TECHNICAL FIELD

The present invention is directed to concentrators, each associated with a plurality of solar cells, for concentrating solar radiation by employing either trough-, trapezoidal-, and cone-shaped near-ideal, non-imaging concentrator elements, with or without a graded refractive index (GRIN) or a reflective second stage that replaces the refractive optics. The 2-dimensional version of the second stage may use a biaxial graded index of refraction profile, whereas the 3-dimensional version employing a cone-shaped first stage may use a radial index profile.

BACKGROUND ART

Solar cells find extensive application in space-related vehicles for providing power from the sun. Obviously, high efficiency solar cells, such as multijunction (MJ) cells, are preferably utilized; however, such high efficiency solar cells tend to be expensive. Due to the high overall expense of satellite launch, deployment, and operation in space, it is desirable to extend the lifetime of the solar cells, whether in earth orbit, at various altitudes, or on an interplanetary mission. It is further desirable to provide a concentrator for solar cells in space environments that yields higher concentration ratios (on the order of 50× or more), while at the same time providing shielding against charged particles (mostly electrons and protons) within the energy range of a few KeV to 100 MeV. Further, such a concentrator must be light-weight and compact and must not require excessive solar tracking.

Solar cells employed in space applications require protection from damaging effects of solar radiation. Radiation damage-induced degradation of the power output of silicon solar arrays is well-known. One approach to reduce this problem is through the use of gallium arsenide (or other III-V compound semiconductor) solar cells. Such III-V devices evidence a superior radiation hardness as compared to silicon solar cells. However, such III-V devices are also more expensive, as compared with silicon solar cells.

Cover glasses are commonly used to shield the solar cells from part of the damaging radiation. However, the effectiveness of such cover glass protection is limited, and leads either to solar cell life limitations because the cover glasses have to be thin or to weight penalties if the cover glasses are made too thick. Further, such cover glasses fail to provide any concentration of the solar radiation. The concentration ratio is thus 1× and no savings in cell cost is evidenced.

Concentrators have been developed for space applications. One such example is discussed in U.S. Pat. No. 4,494,302, which uses a Cassegrain mirror concentrator. A solar cell is exposed to concentrated sunlight in the Cassegrain mirror concentrator in which the light is focused by a secondary mirror on the solar cell attached to the front of a primary mirror. The back of the primary minor is made black, and thus serves as a radiator, dissipating the heat from the solar cell. However, such concentrators suffer from a tracking problem, in that with concentrators of large ratio, the image easily moves out of the focal point as the sun's position moves away from the normal to the aperture plane of the module. For example, for a 2-D ideal concentrator trough providing a concentration ratio of 500×, a shift in position of the sun by only 0.1° from normal is all that is necessary for the image to be out of the focal point. Thus, acceptance angle of any concentrator must be optimized so as to minimize the output power losses caused by tracking errors.

Trough-shaped, non-imaging, ideal concentrator elements are known for concentrating solar radiation onto earth-based solar cells and for increasing acceptance angle; see, e.g., U.S. Pat. No. 4,964,713 to Goetzberger, and U.S. Pat. Nos. 3,923,381 and 4,114,592, both to Winston. Such concentrator elements may comprise two stages. The Winston patents disclose a first stage comprising a trough with parabolic sides which are mirrored and a second stage comprising a dielectric material using total internal reflectance (TIR). The Goetzberger patent discloses a first stage comprising a trough with parabolic sides in which the trough comprises glass or plastic and a second, smaller stage comprising either the same or a different material, also having parabolic sides.

Goetzberger's trough of glass or plastic adds undesirable weight for space applications, while for practical purposes, Winston's combination only achieves a concentration of about 5 times (5×) and requires an undesirably long distance from the entrance of the first stage to the surface of the solar cell.

Thus, a concentrator that provides excellent off-normal performance, reduced focal distance (hence, reduced mass), high concentration, and light weight is desired.

DISCLOSURE OF INVENTION

In accordance with the present invention, a solar concentrator that provides the above desirable features, while avoiding most, if not all, of the prior art limitations is provided. The solar concentrator comprises two stages. The first stage comprises a trapezoid-shaped (2-D/3-D) concentrator cusp unit having two major opposed sides joined by two ends. The inner surfaces of the first stage concentrator are mirrored. Further, the ends have two flat, angled surfaces, while the two sides have optimized Bezier surfaces that approximate the paraboloid surfaces used in the prior art. In one embodiment, the second stage comprises a bi-axial gradient refractive index element, in which two gradient refractive index materials, each having a high index surface and a low index surface, are joined together along their high index surfaces. The two ends of the bi-axial element are flat, while the two sides have optimized Bezier surfaces that approximate paraboloid surfaces. The top surface of the bi-axial element is provided with a cylindrical surface, while the bottom, or exit, surface is ground flat and polished. The high index boundary is parallel to the side surfaces of the first stage unit.

A solar cell that is mounted on a thin, high thermal conductivity, ceramic substrate is bonded to the flat exit surface of the second stage of the concentrator of the present invention. An array of such concentrators and solar cells, in which the solar cells are electrically interconnected, may then be deployed for converting solar energy into useful electrical energy.

The concentrator of the present invention evidences much lower mass than prior art concentrators. Further, as the normal onto the array, or panel, of solar cells is out of alignment with the sun as the spacecraft wobbles or changes attitude in space, the concentrator will continue to operate, at relatively high efficiencies, due to the large off-normal performance capability. Concentration ratios in the order of 50× are realized with the present concentrator. A three-dimensional (3-D) version of the same concept is suitable to evidence concentration ratios in excess of 300× with very good off-normal performance.

In a second embodiment, the GRIN lens of the second stage is replaced by a reflector second stage that also has Bezier optimized sides.

Other objects, features, and advantages of the present invention will become apparent upon consideration of the following detailed description and accompanying drawings, in which like reference numeral designations represent like features throughout the FIGURES.

BRIEF DESCRIPTION OF THE DRAWINGS

The drawings referred to in this description should be understood as not being drawn to scale except if specifically noted.

FIG. 5c is a view similar to that of FIG. 5b, but taken along the line 5c—5c of FIG. 4a;

FIG. 13 is an enlarged view of a portion of FIG. 12, showing more details of the focal spot;

FIG. 13a is a side elevational end view of a graded index dielectric second stage, employed in the practice of the invention, from a bi-axial slab of graded index of refraction material;

BEST MODES FOR CARRYING OUT THE INVENTION

Reference is now made in detail to a specific embodiment of the present invention, which illustrates the best mode presently contemplated by the inventor for practicing the invention. Alternative embodiments are also briefly described as applicable.

Figure 1:
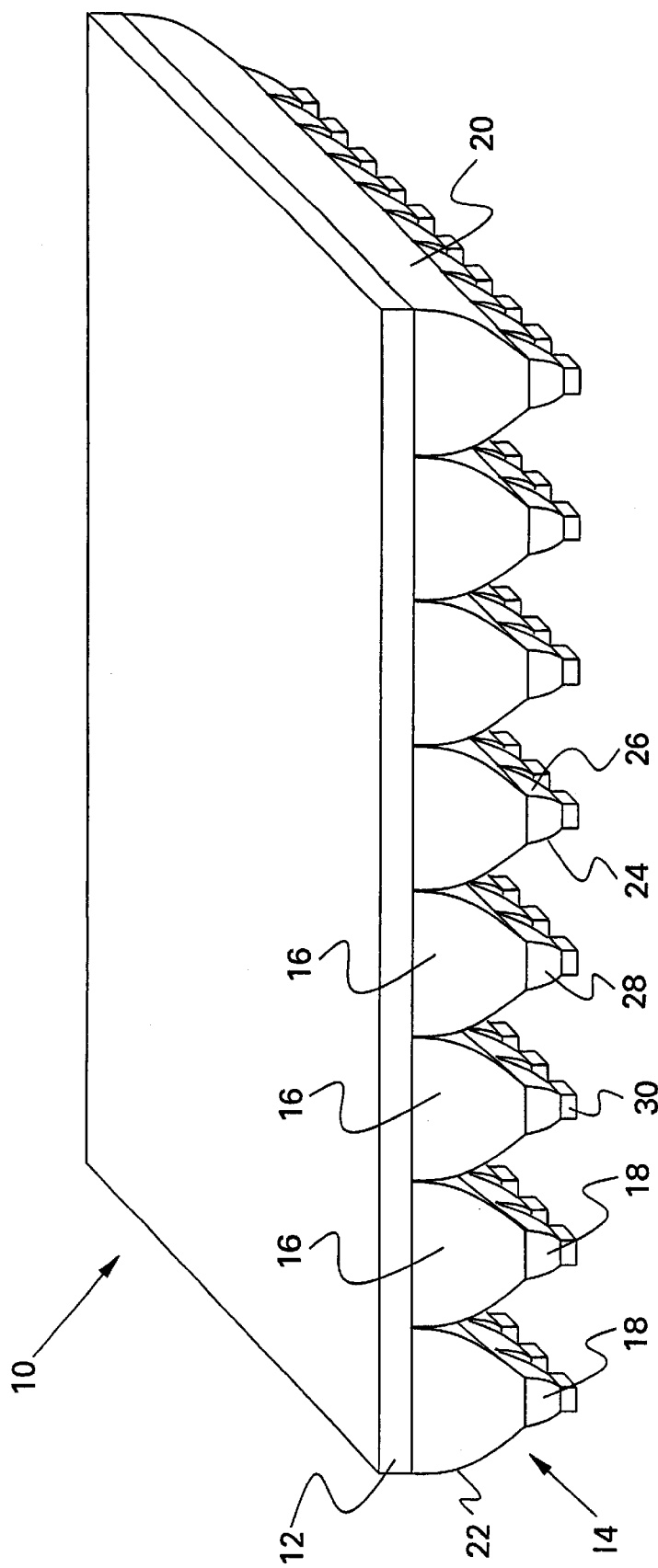
FIG. 1 is a perspective view, depicting an array of two-stage concentrators of the prior art.

Turning now to the Figures, FIG. 1 shows a two-stage concentrator arrangement 10 of the prior art, as represented by Goetzberger, supra, comprising a plate 12 of transparent material having a refractive index greater than 1.45, which is flat on both sides and which is connected optically and mechanically with a structure 14 for the non-imaging concentration of light. The structure 14 provides a two-stage concentration of the light in linear-uniaxial first stages 16 and two-axial second stages 18.

The first stages 16 have the form of a trough made of glass or plastic; the longitudinal walls 20, 22 are parabolically curved. Each second stage 18, of trapezoidal shape, is connected optically and mechanically to the exit aperture surface of a first stage. The second stage units 18, which comprise an optical material having an index of refraction greater than that of the first stage units 16, also have parabolically bent side walls 24, 26, as well as parabolically bent front walls 28 and rear walls (not shown). The bottom surface of each second stage 18 is optically coupled with a solar cell 30.

Figure 2:
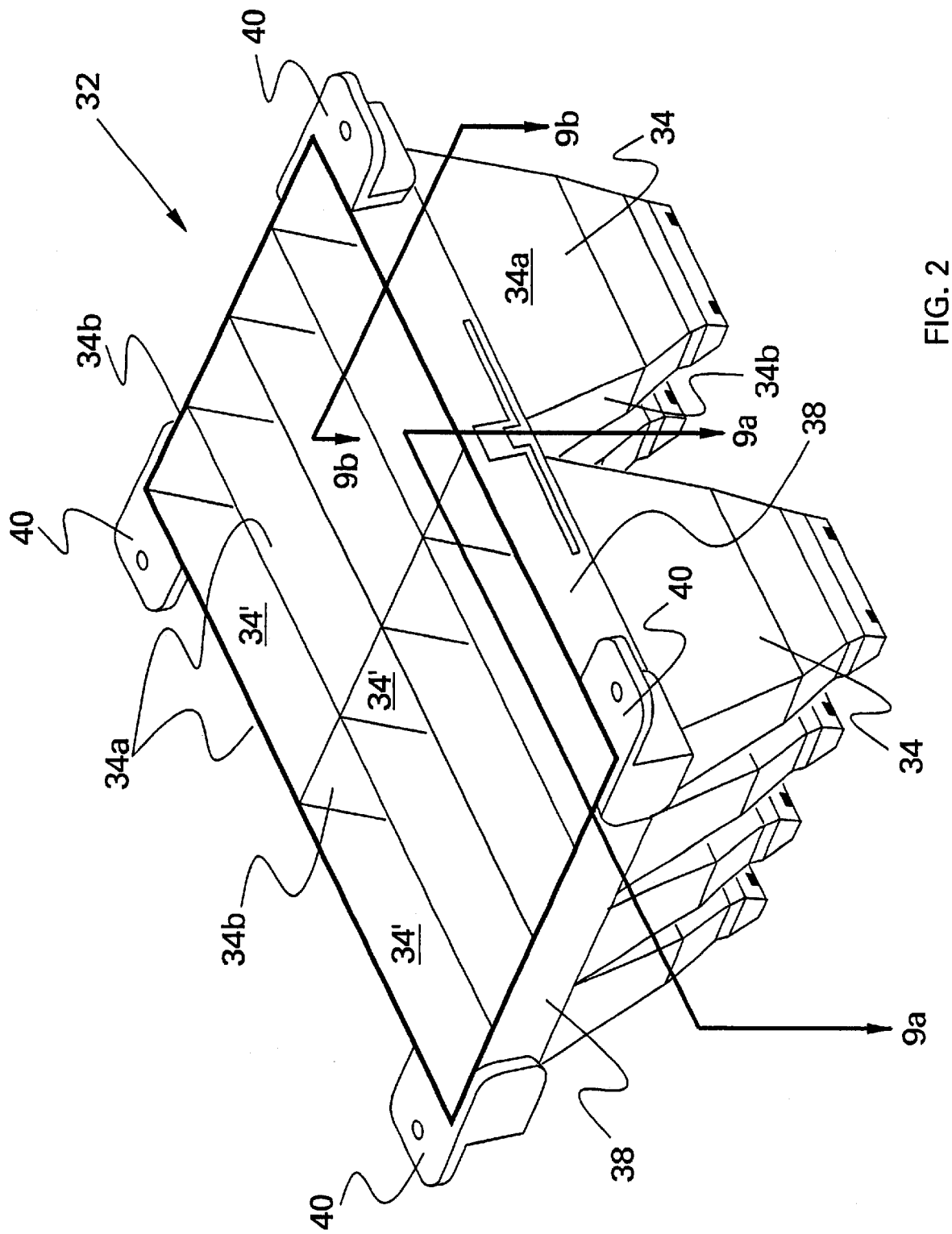
FIG. 2 is a perspective view, depicting a two-stage concentrator sub-array of the present invention.
Figure 6:
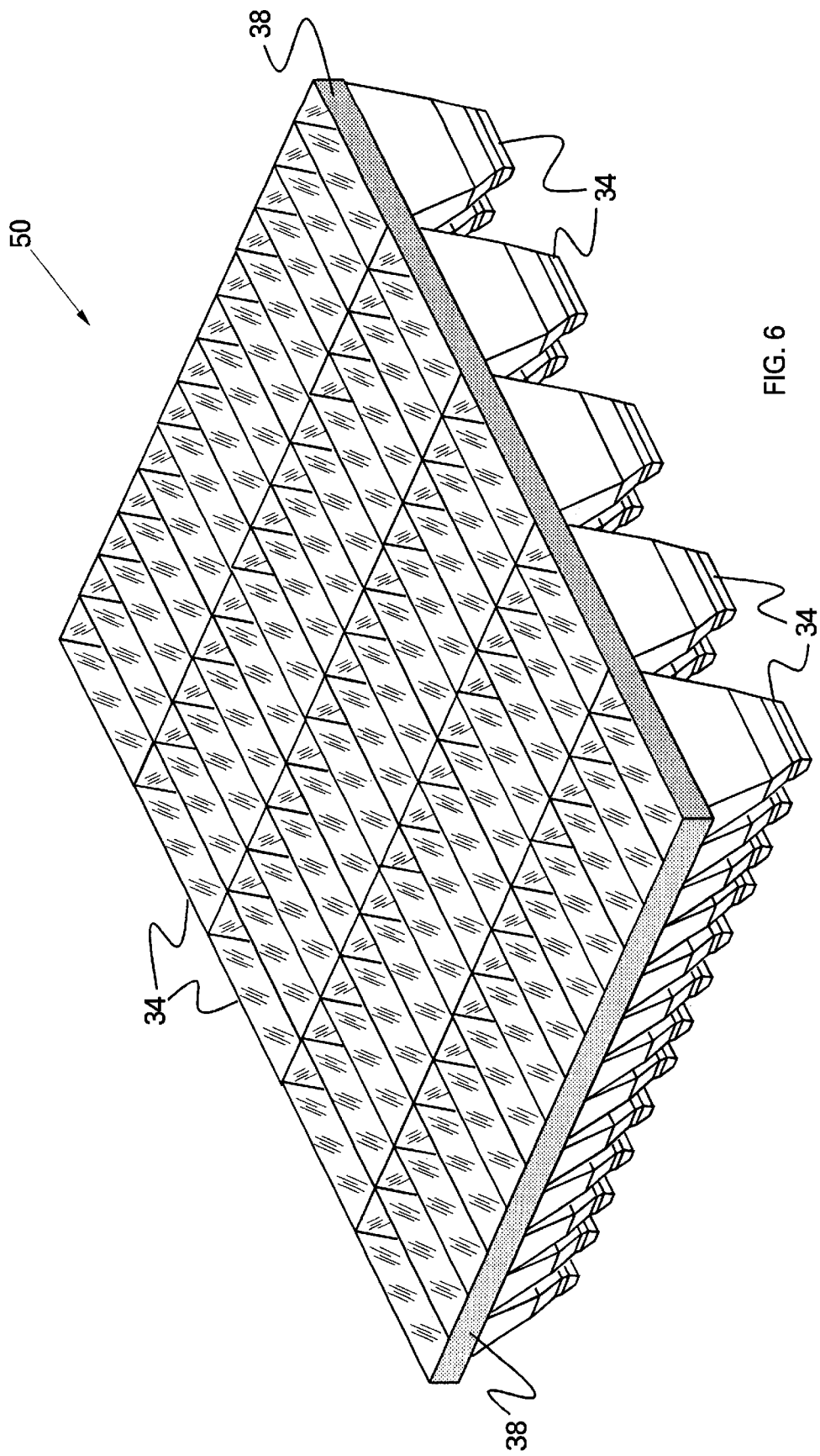
FIG. 6 is a perspective view, depicting a module comprising a plurality of two-stage concentrators.

FIG. 2 depicts a sub-array 32 of a two-stage concentrator of the present invention. As seen in FIG. 2, eight compound parabolic concentrator (CPC) cusp assemblies 34 are depicted; as seen in FIG. 6, a fill array of 13×5 such cusp assemblies are joined together.

Figure 3:
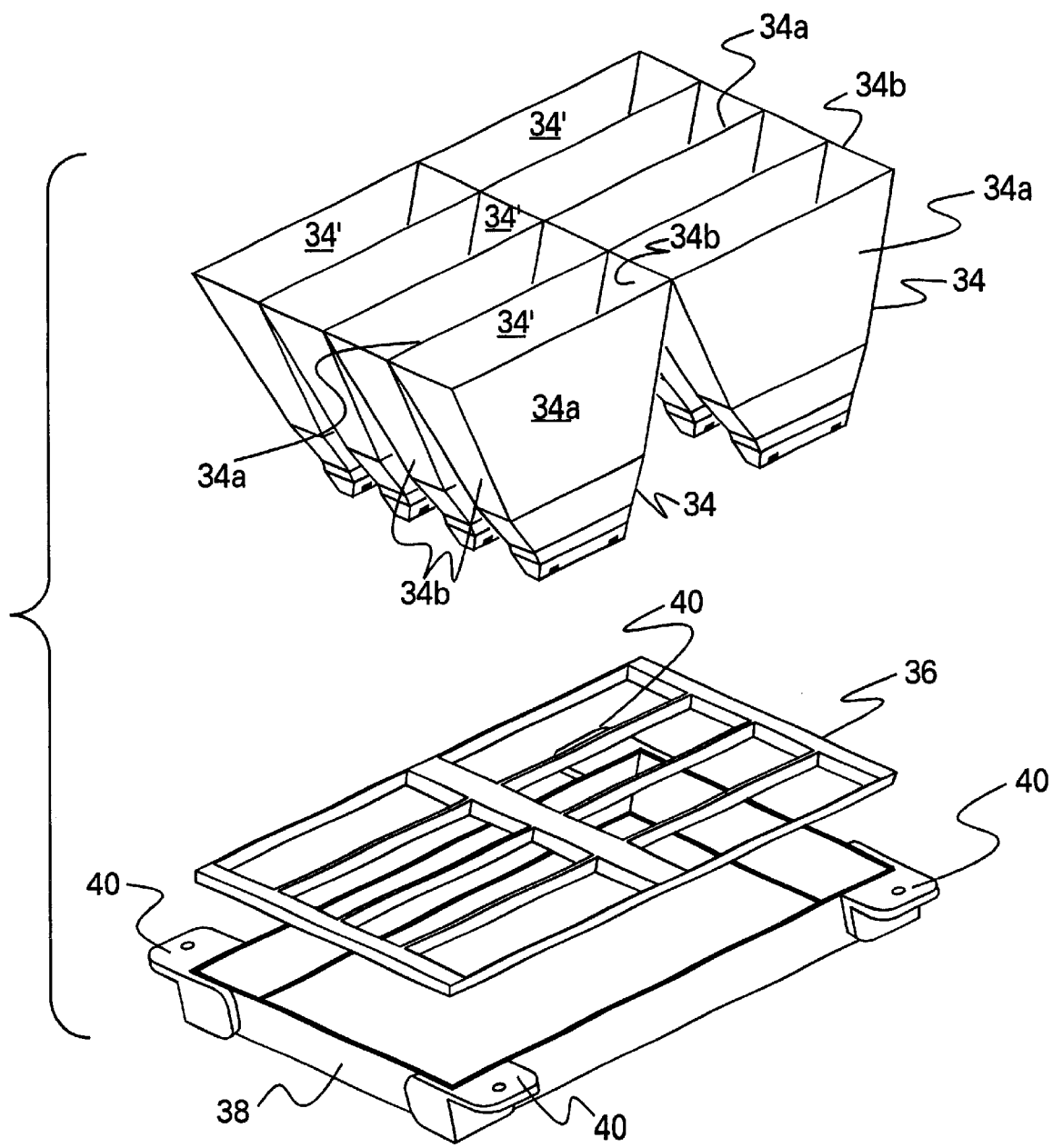
FIG. 3 is an exploded perspective view, depicting the parts of the sub-array of FIG. 2.

As shown in FIG. 3, the sub-array 32 further comprises a perforated tray 36 for supporting the individual cusp units 34, a frame 38 for supporting the perforated tray and the integrated cusp units, and angle supports 40 for mounting the sub-array on any test platform.

Figure 4:
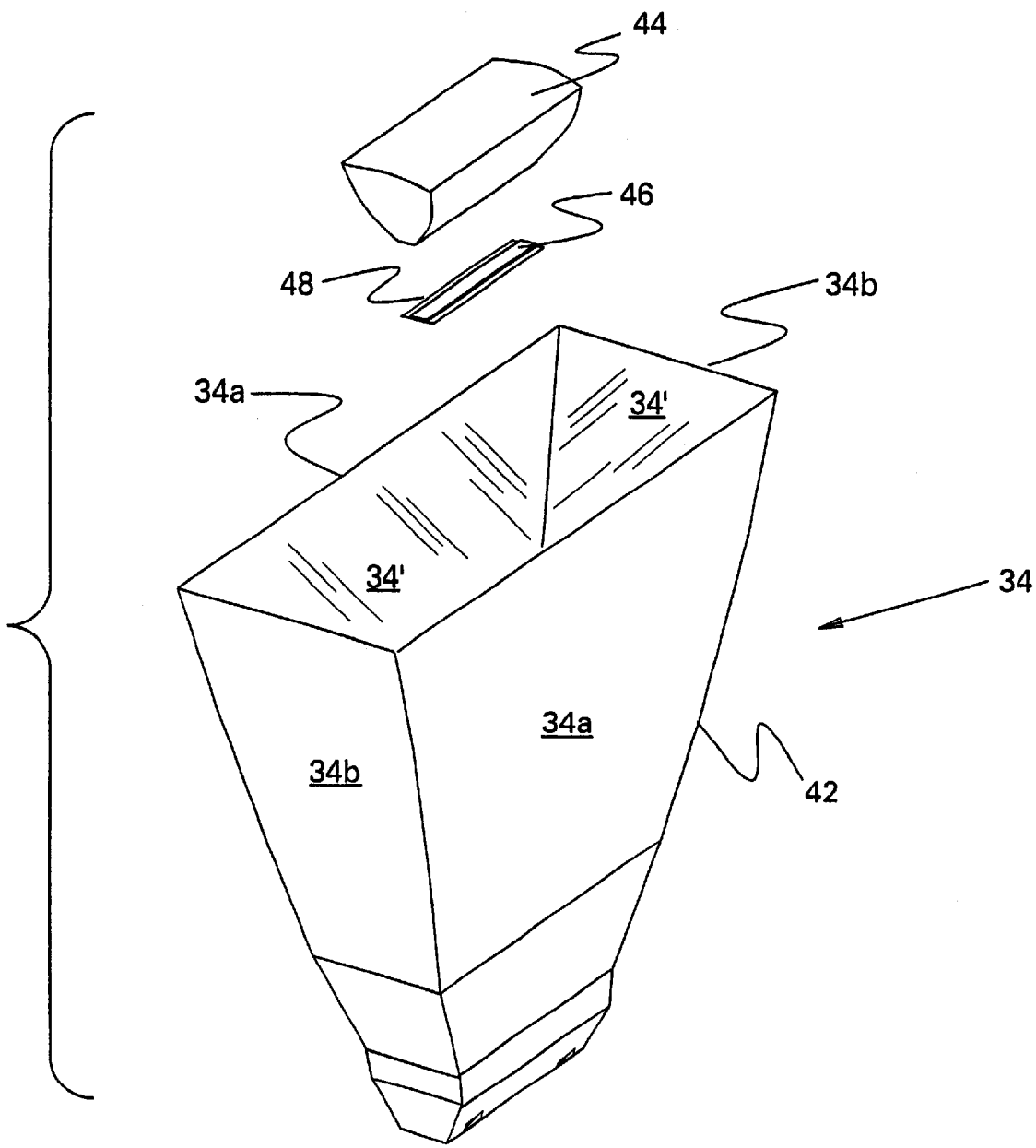
FIG. 4 is an exploded perspective view, depicting the elements of a single two-stage concentrator, with bi-axial lens and solar cell.
Figure 4A:
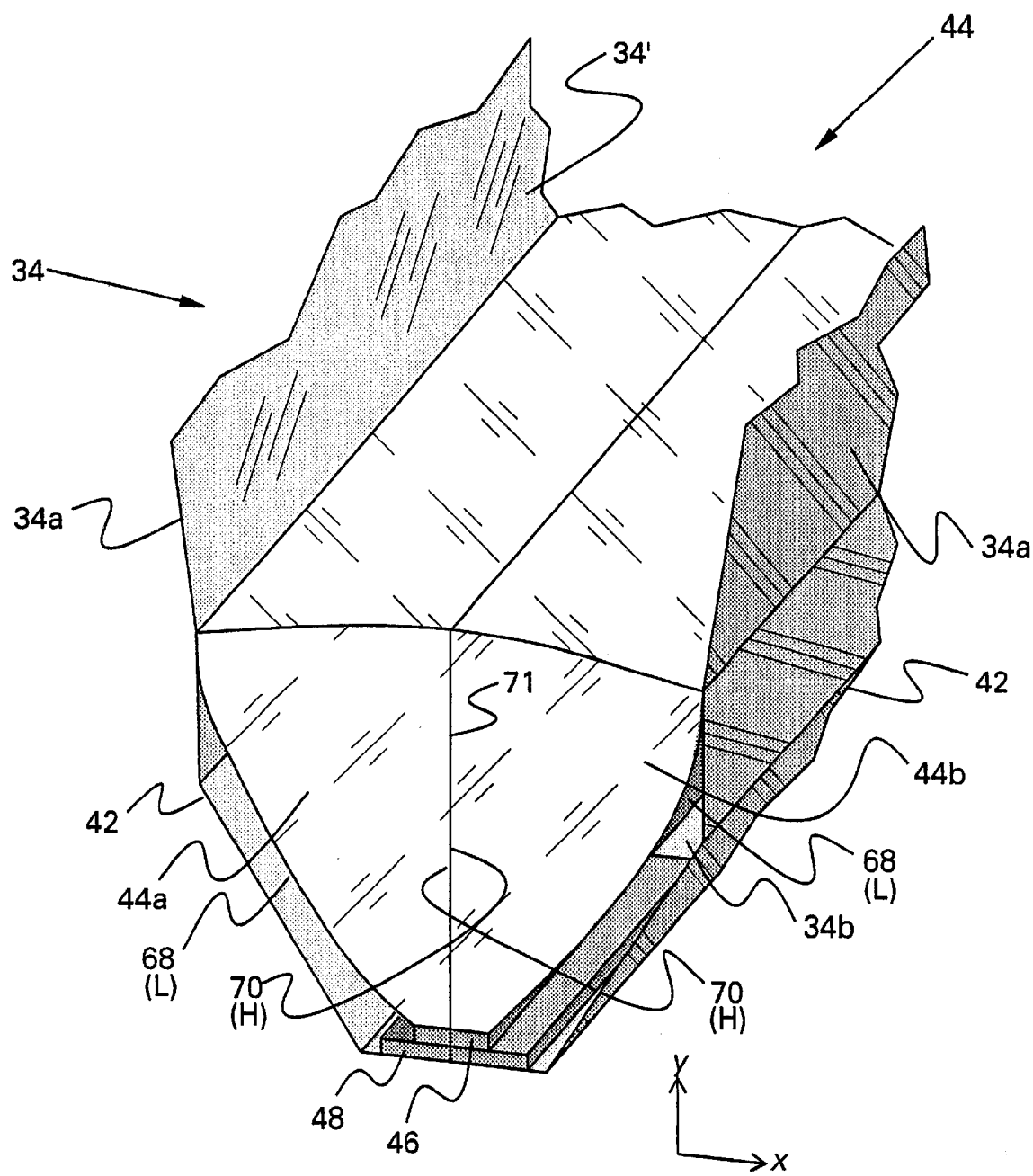
FIG. 4a is an enlarged perspective view, partly in section, of the lower portion of the concentrator, showing the bi-axial lens, the solar cell, and a substrate which supports the solar cell.

The principal components of the concentrator cusp unit 34 are shown in FIG. 4, in which a composite shell 42 contains a bi-axial, gradient index of refraction lens 44 and a solar cell 46 secured to the bottom portion of the bi-axial lens. The bi-axial lens 44 and solar cell 46 are described in greater detail below. The solar cell is supported by a substrate 48, also described in greater detail below. FIG. 4a is an enlargement, showing the lower end of the shell 42, the bi-axial lens 44, and the solar cell 46, which is secured to a substrate 48. The lens top (edges) are secured to the cusp side walls along the line of contact.

Figure 5A:
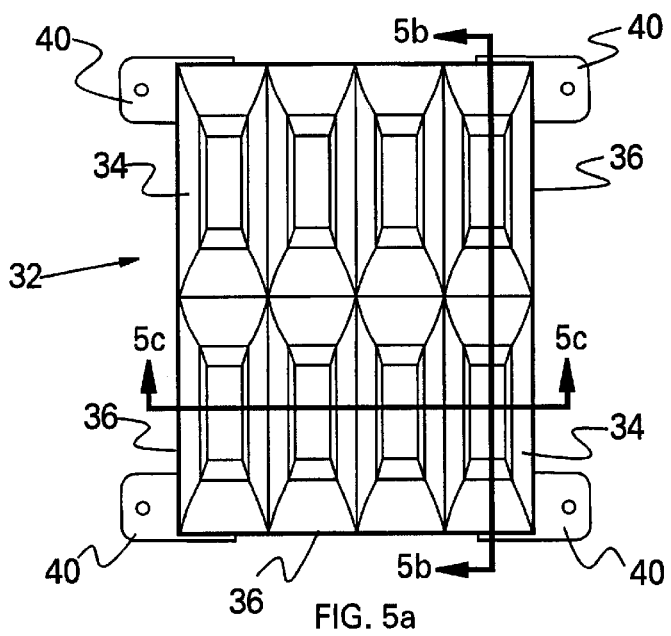
FIG. 5a is a top-plan view of the sub-array of FIG. 2.
Figure 5B:
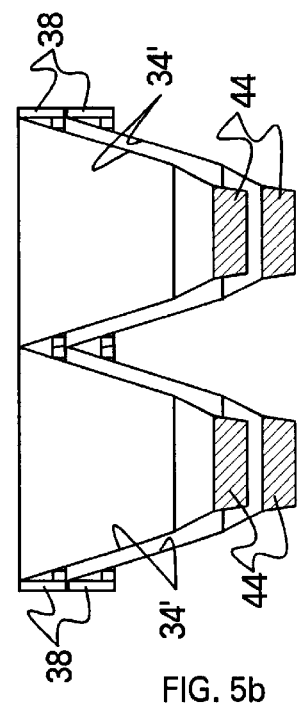
FIG. 5b is a cross-sectional view taken along line 5b—5b of FIG. 5a, showing a nesting configuration for stowage of a plurality of sub-arrays.
Figure 5C:
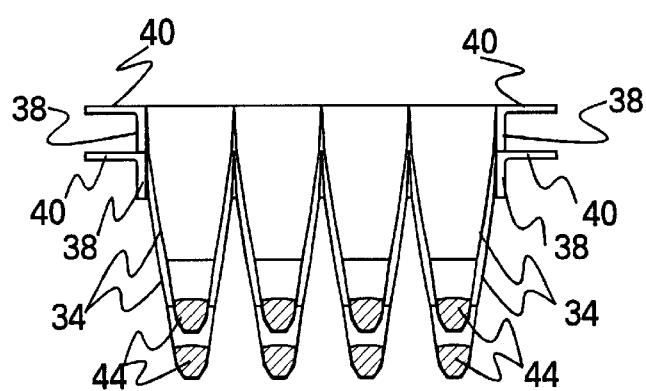

FIG. 5a depicts a top-plan view of the sub-array 32, while FIGS. 5b and 5c depict a nested configuration for stowage for launch. This compact stowage is an advantageous result of the configuration of the sub-array 32, as well as the full array shown in FIG. 6, described below. This is especially useful on launch vehicles, where stowage space, like weight, is at a premium. Nesting of a plurality of sub-arrays 32 permits subsequent deployment into a full scale solar panel array, or module, once the spacecraft is deployed from the launch vehicle to start its mission in space.

A full-size two-stage concentrator module 50 is shown in FIG. 6, comprising an array of 65 cusp assemblies 34 in a 13×5 configuration. In one embodiment, the linear dimensions in the x-y directions are 50 cm×50 cm. The module design is extendible to larger panels (200 cm×100 cm) and is therefore suitable to fabricate 5 kW or larger concentrator array systems.

Figure 7:
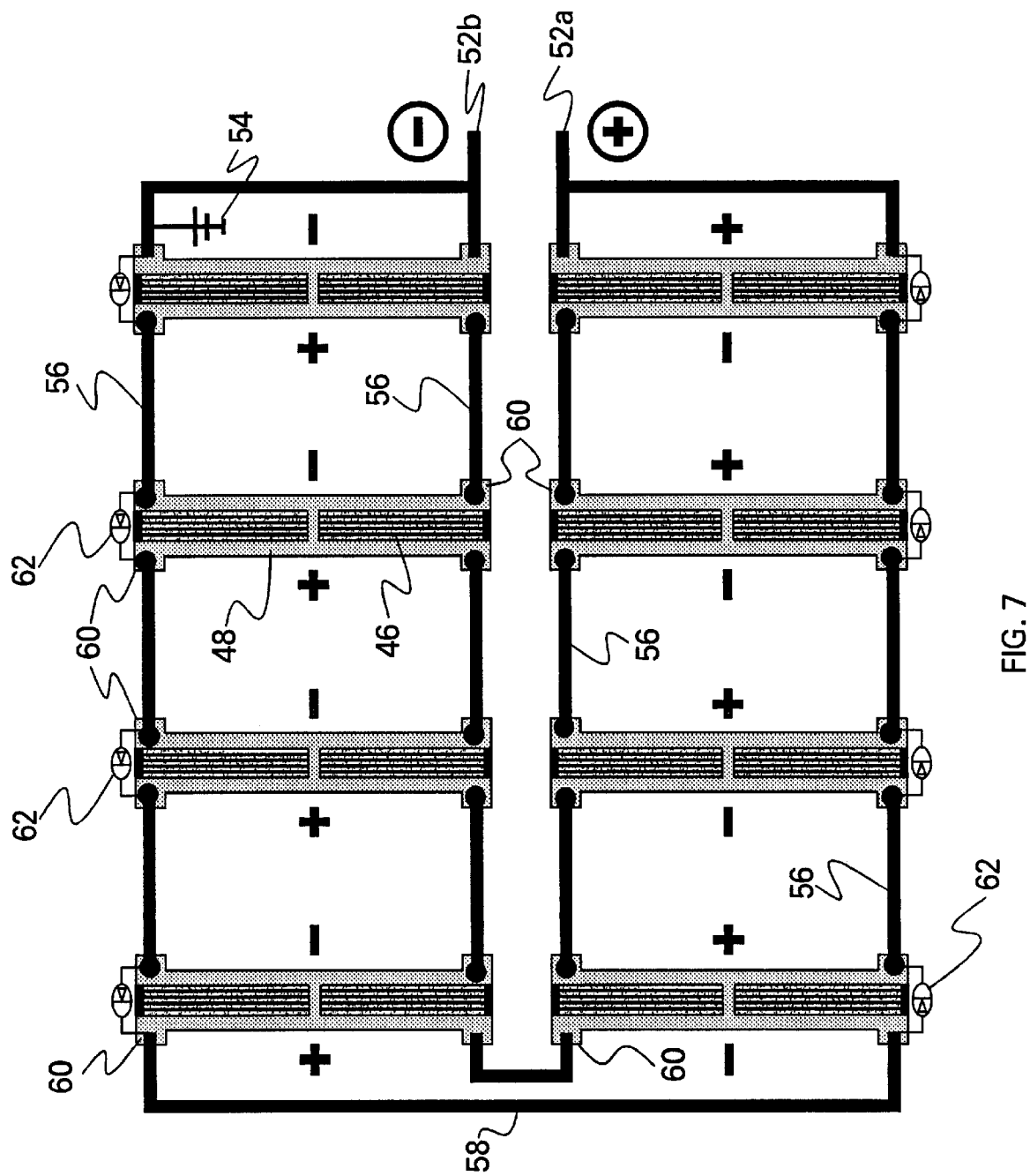
FIG. 7 is a schematic diagram of the electric circuitry layout in connecting the solar cells together.

FIG. 7 depicts the electrical circuitry layout for the sub-array 10. Soldering terminals 52a, 52b on the ceramic substrate 48 provide electrical access to external circuitry (not shown). Negative terminal 52b includes a system ground connection 54. Flex interconnects 56 are used to connect one cusp assembly 34 to another. Flex interconnects 58 are used to connect one row of cusp assemblies 34 to an adjacent row. Solar cells 46 are secured on metal-coated ceramic substrates 48; commonly, copper is used for the metal coating. Typically, the solar cells 46 comprise a group of cells or single cells that are connected to each other in series to form a cell string.

The ceramic substrate 48 comprises a high thermal conductivity material, such as aluminum nitride.

Solder pads 60 permit soldering of the interconnects 56, 58. The solder pads 60 are usually provided with an additional metallized area with pre-applied solder to facilitate soldering.

Bypass diodes 62 are connected in parallel with each solar cell 46 in the usual manner. The bypass diodes 62 serve to shunt current past a cell 46 in the event of failure, so as to permit the entire string to continue working. The polarity of each cell 46 is shown next to that cell.

Figure 8:
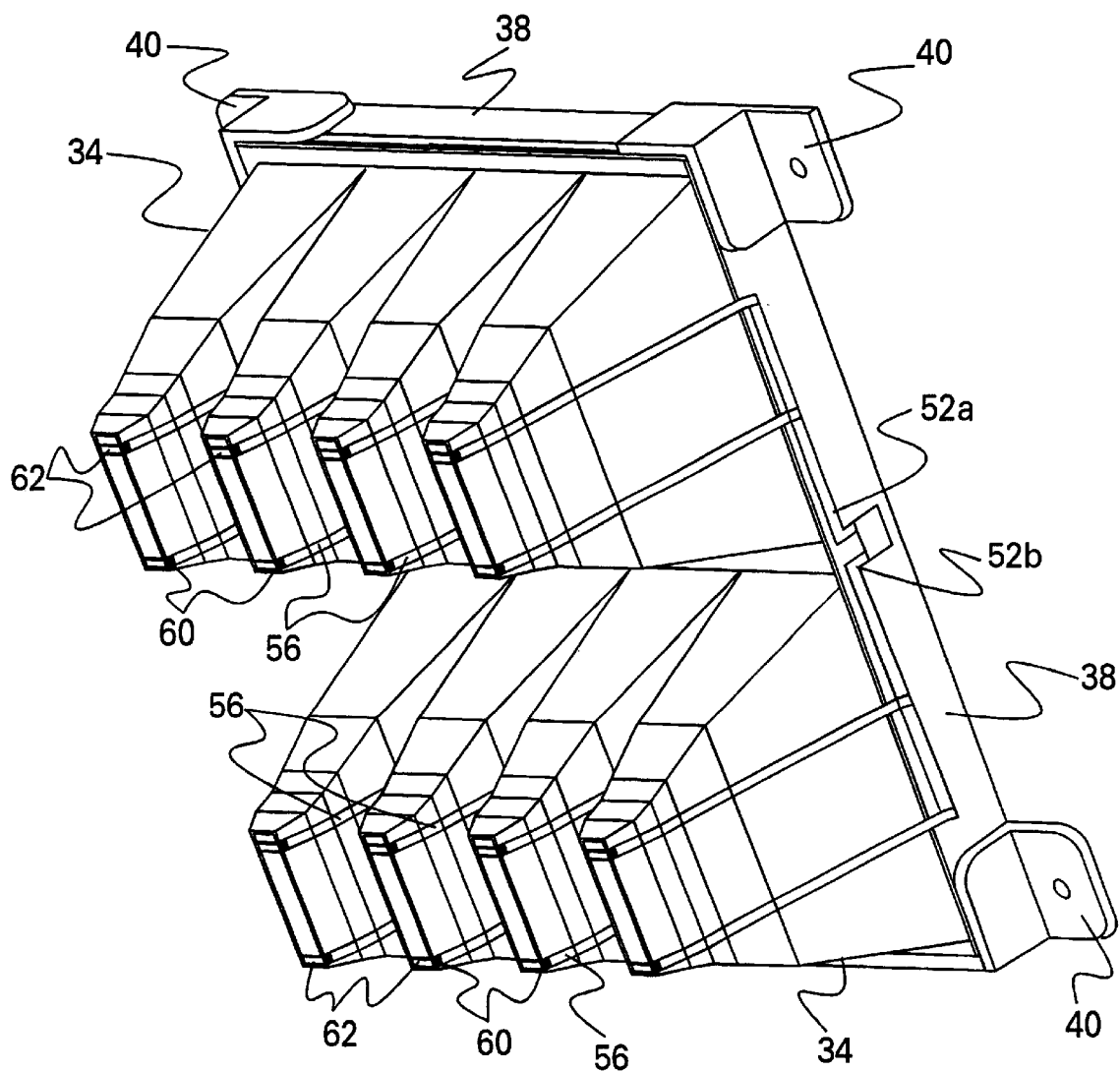
FIG. 8 is a perspective view, showing the external electrical terminals for the circuit depicted in FIG. 7.

A portion of the electrical interconnections is shown in FIG. 8. The flat interconnections run along the outside contour of the CPC cusp assemblies 34 and do not interfere with the nesting process for spacecraft launch.

Figure 9:
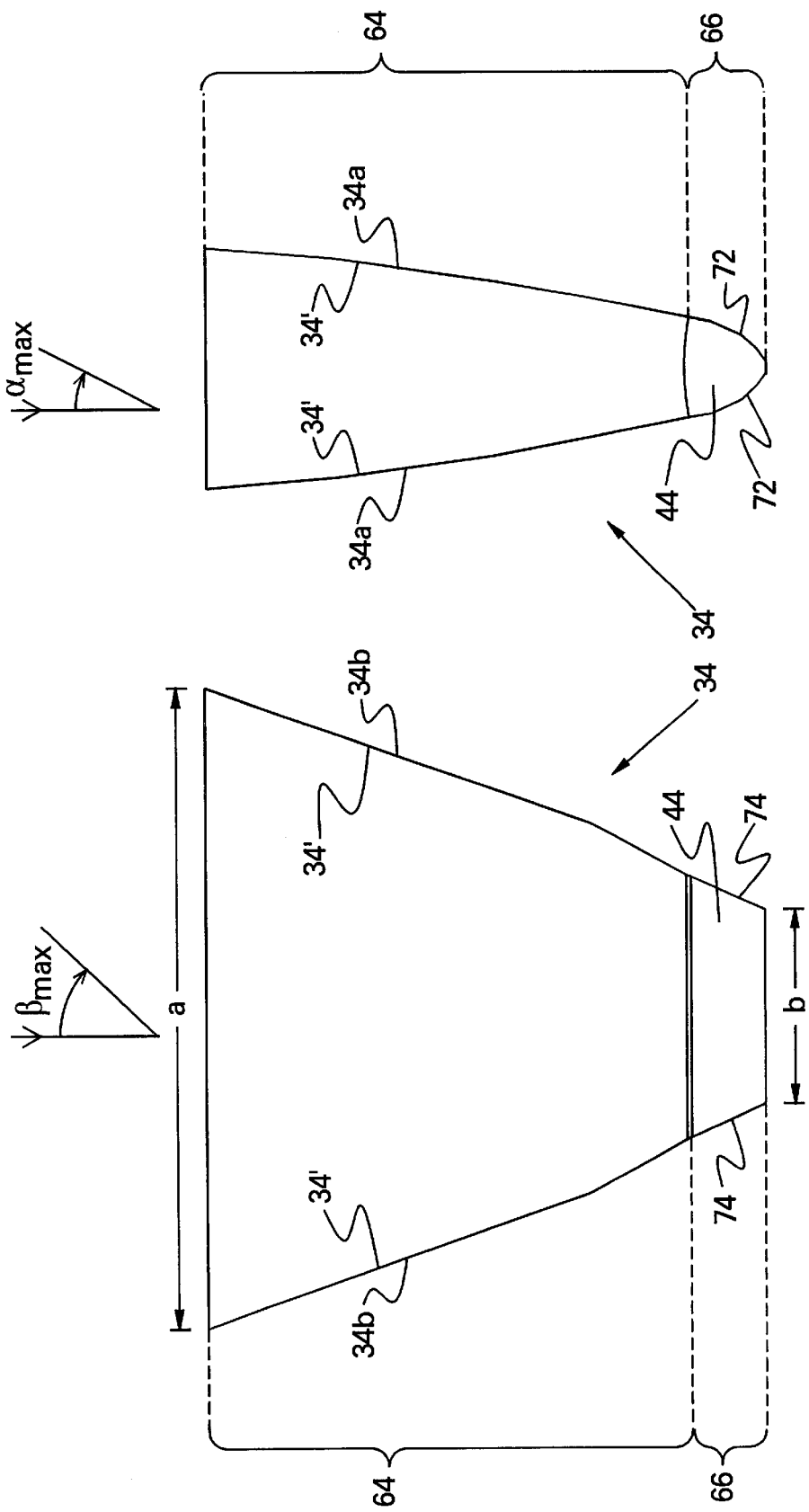
FIG. 9a is a cross-sectional view, depicting a single two-stage concentrator taken along the line 9a—9a of FIG. 2.
FIG. 9b is a cross-sectional view, depicting the single two-stage concentrator taken along the line 9b—9b of FIG. 2.

FIGS. 9a and 9b depict the optical cross-sections, in which plane surfaces are used in place of curved sidewalls. Such a construction minimizes production costs without degrading the optical performance appreciably. As seen in FIGS. 2 and 9, the cusp assemblies 34 are rectilinear, having two opposed relatively longer sides 34a joined by two orthogonally placed, opposed relatively shorter sides 34b. In particular, FIG. 9a shows the plane surfaces of sides 34b, both for the first stage 64 and the second stage 66 portions of the concentrator 12. In FIG. 9b, the sides 34a of both first and second stages 64, 66 comprise optimized Bezier surfaces, which approximate a parabolic surface with a cylindrical surface, for ease of fabrication.

The inside 34' of each cusp assembly 34 is provided with an integral mirrored surface, which serves to direct incident rays from a light source, such as the sun, onto the bi-axial lens 44. The mirrored surface comprises any metal film that provides a high degree of reflectance, such as silver or aluminum. The thickness of the metal forming the mirrored surface 34' is on the order of 100 nm. Preferably, an enhanced silver or aluminum mirror that has a multitude of λ/4 dielectric coatings to improve the reflectance and also provide some protection is employed.

The bi-axial lens 44 comprises two sub-elements 44a and 44b, both of which have an axial gradient index of refraction running from a relatively low index of refraction at one surface 68 to a relatively high index of refraction at the opposite surface 70, as depicted in FIG. 4a. The bi-axial lens 44 is formed by joining the two sub-elements 44a, 44b together at their respective high index surfaces 70. The joining of the two sub-elements 44a, 44b may be done by using an appropriate optical cement or by fusing the two faces 70 together to form a continuous high index plane 71. Such axial gradient index of refraction sub-elements and bi-axial lenses are known and are available from LightPath Technologies, Inc. (Albuquerque, N. Mex.) under the trademark GRADIUM®.

The high index plane 71 is parallel to the major sides 34a of the concentrator cusp 34.

Figure 10:
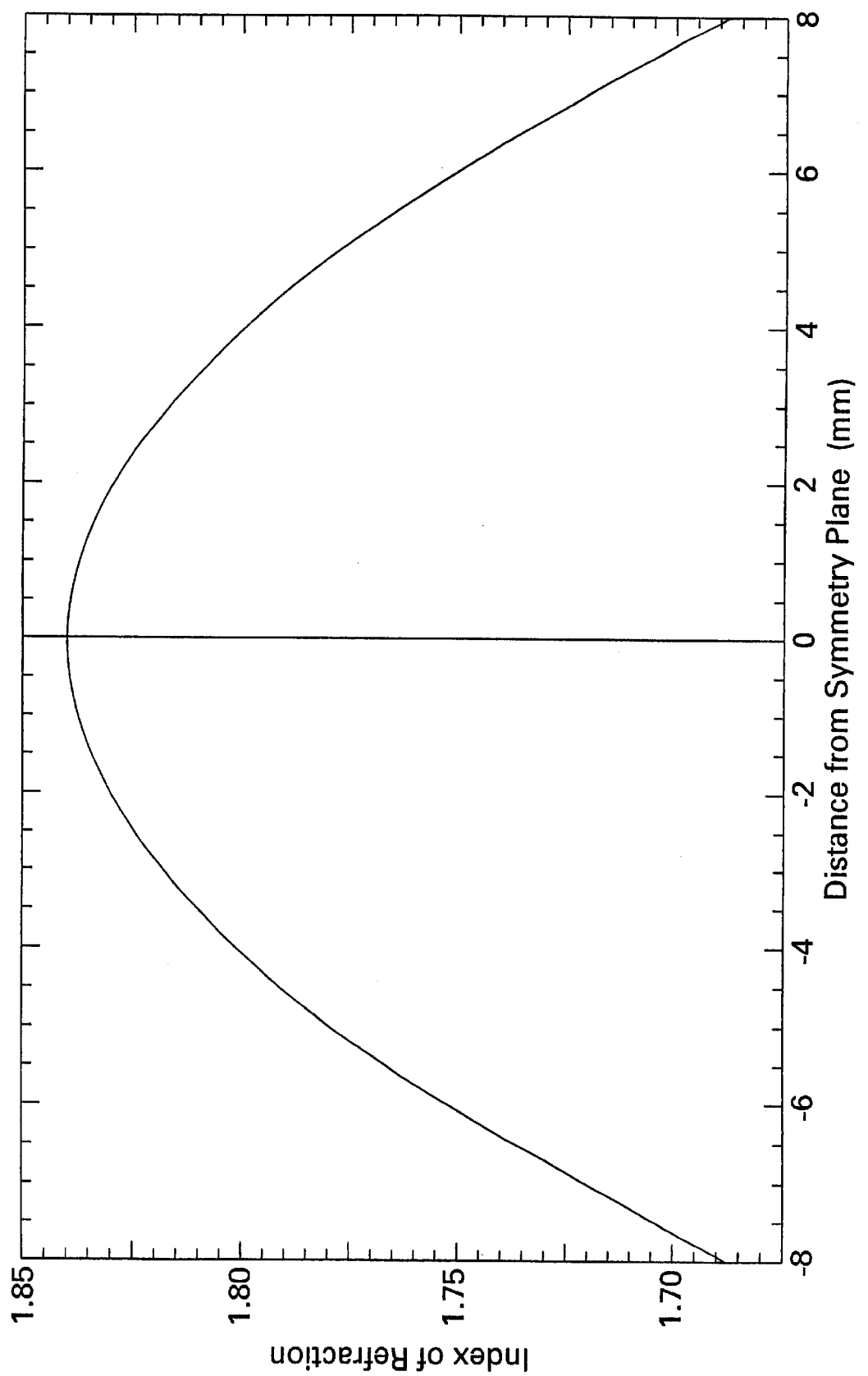
FIG. 10, on coordinates of index of refraction and distance from a symmetry plane, is a plot of the index of refraction profile of the bi-axial lens.

FIG. 10 is a plot depicting the gradient index profile of a theoretical bi-axial lens useful in the practice of the invention. In this plot, a quadratic gradient index profile is depicted; however, other profiles may also be advantageously employed in the practice of the present invention. The minimum index of refraction value $n_{min}$ is 1.69, while the maximum value $n_{max}$ is 1.84, providing a Δn of 0.15. A bi-axial lens suitably employed in the practice of the invention is available from LightPath Technologies, Inc., under the trade designation SCP-450II.

The bi-axial lens 44 is characterized by sides 72 and ends 74. The sides 72 are ground to Bezier shapes, as with the sides 34a of the cusp assemby 34, to approximate a parabolic curve. The ends 74 are ground flat.

Previous work by Roland Winston and Ari Rabel has shown that a dielectric filled ideal compound parabolic concentrator (CPC) for a 2-D or 3-D configuration allows higher concentration than an "empty" CPC of the same aperture and height (R. Winson, "The Optics of Nonimaging Concentrators—Light and Solar Energy", Academic Press, pp. 77–79 (1978)). For an "empty" CPC, i.e., filled with air ($n_0=1$), we have $$CR_{3D} = \frac{1}{\sin\theta_{max}^2} \qquad CR_{2D} = \frac{1}{\sin\theta_{max}}$$

For the dielectric CPC, this becomes $$CR_{3D} = \frac{n^2}{\sin\theta_{max}^2} \qquad CR_{2D} = \frac{n}{\sin\theta_{max}}$$

where $\theta_{max}$ is the maximum acceptance angle (same for both), n is the refractive index of the dielectric, and the CRs are the respective concentration ratios. As all useful optical materials have refractive indices larger than unity (1), filled CPCs have higher concentration ratios.

The practical downside of the dielectric CPC is its much larger weight and also its cost. In an effort to circumvent this difficulty, the same authors have studied two-stage CPCs for photovoltaic applications. The system they studied was a two-stage CPC design that consisted of a first mirrored "empty" CPC, followed by a dielectric CPC with an index of refraction n>1. This design required much less material. However, while a two-stage tandem CPC offers increased acceptance angle, its total length is longer than that of a single "empty" CPC.

The present invention involves the use of a bi-axial graded index second stage in order to further shorten the length of the dielectric and to reduce the mass. The concentrator design is termed "2-D/3-D", which refers to a trapezoidal cusp shape that is created by two 2-D troughs that intersect each other at 90°. This is in contrast to a 2-D linear trough or a pure 3-D cusp that is paraboloid in shape.

Figure 11:
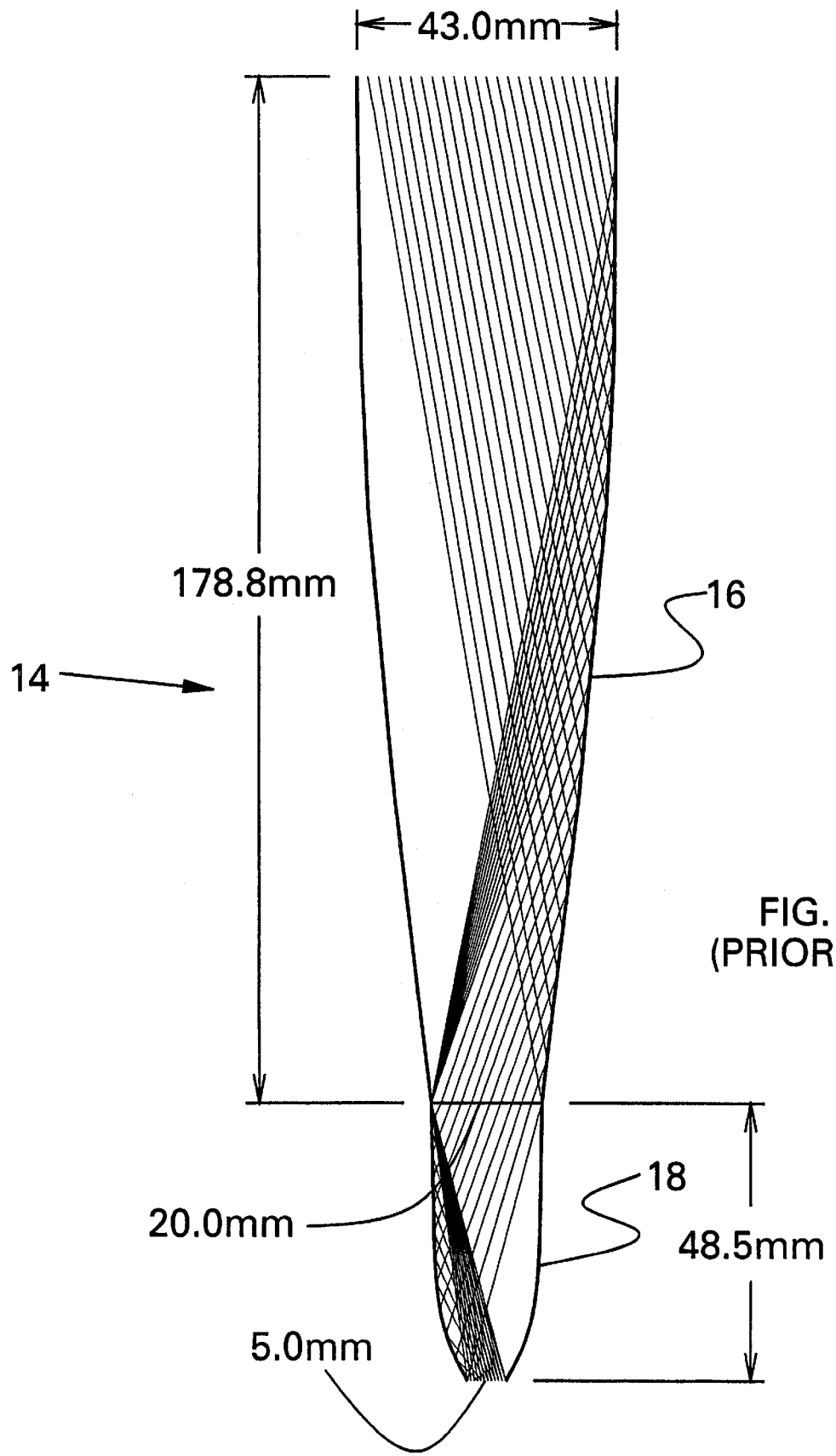
FIG. 11 is a ray tracing of a two-stage concentrator of the prior art, illuminated at an extreme angle, in which the second stage is a uniform index dielectric.
Figure 12:
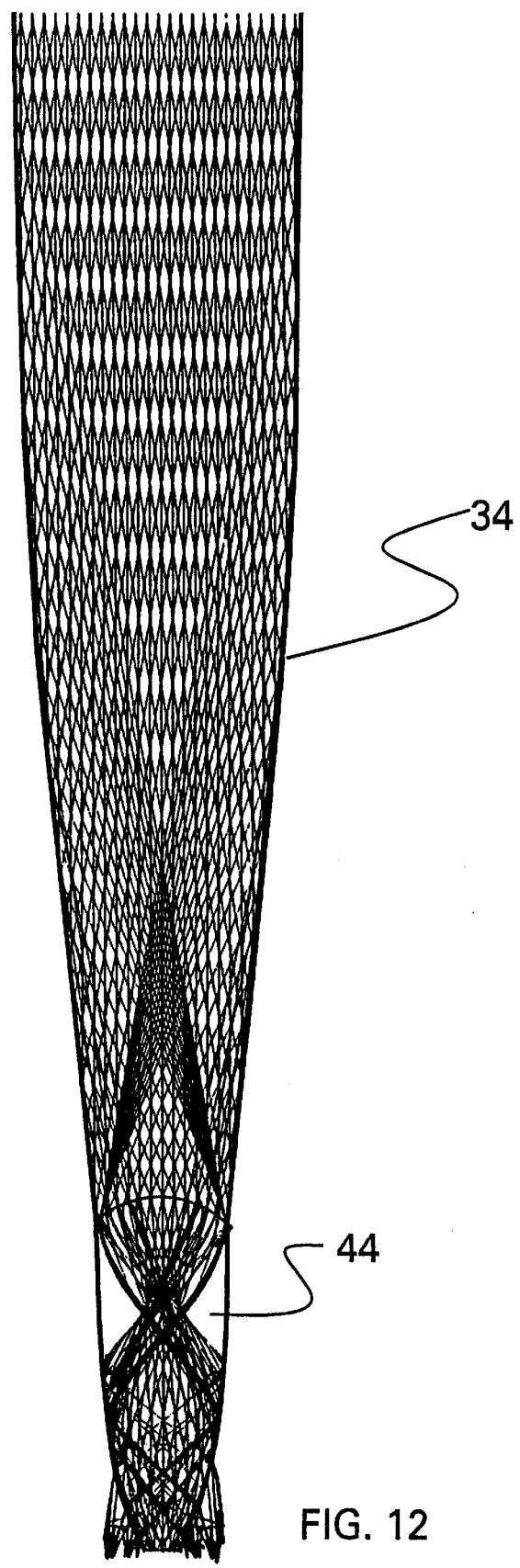
FIG. 12 is a ray tracing of the two-stage concentrator of the present invention illustrating the formation of a focal spot at a shortened distance from the exit when the uniform index dielectric of the prior art is replaced by a bi-axial GRIN lens with a dome in accordance with the teachings of the present invention.
Figure 14:
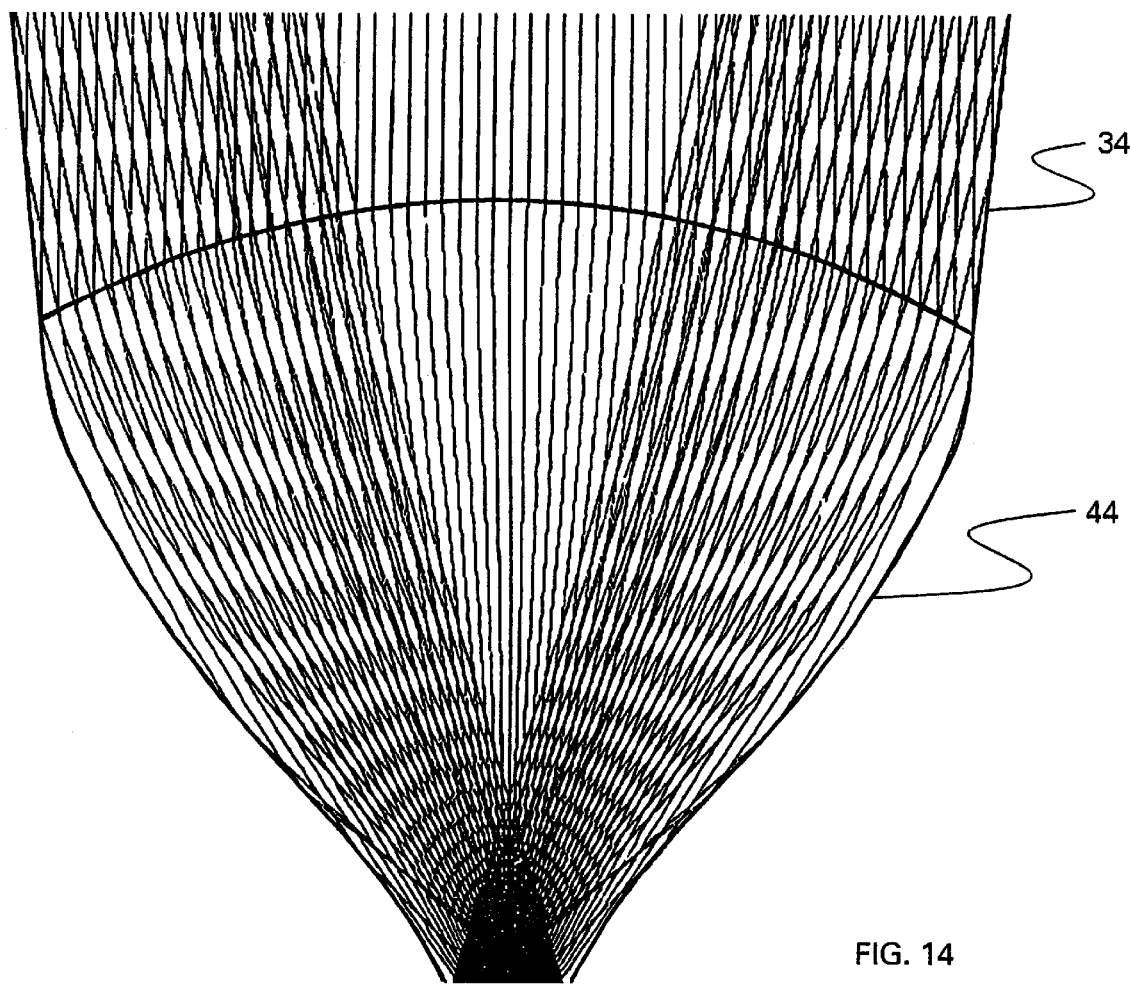
FIG. 14 is an enlarged view of the second stage, where the contour of the side walls of the bi-axial lens have been conformed to the path of the curving rays to thereby effect a further reduction in weight.

FIG. 11 shows a prior art two-stage concentrator illuminated at an extreme angle. As can be seen, the light is focused at the exit aperture to which the solar cell is attached. The height of the dielectric is 48.5 mm. FIGS. 12 and 13 show the formation of a narrow waist, i.e., focal spot, at about 13.0 cm from the top, if the uniform index dielectric is replaced by a bi-axial GRIN lens with a dome. Thus, a solar cell placed at this location experiences about the same light concentration as in FIG. 11. FIG. 14 shows a further reduction in weight where the contour of the side walls are conformed to the path of the curving rays. While FIG. 14 shows primarily the bi-axial lens 44, the same effect is observed with conforming the contour of the side walls of the cusp 34 to the path of the curving rays.

Figure 15:
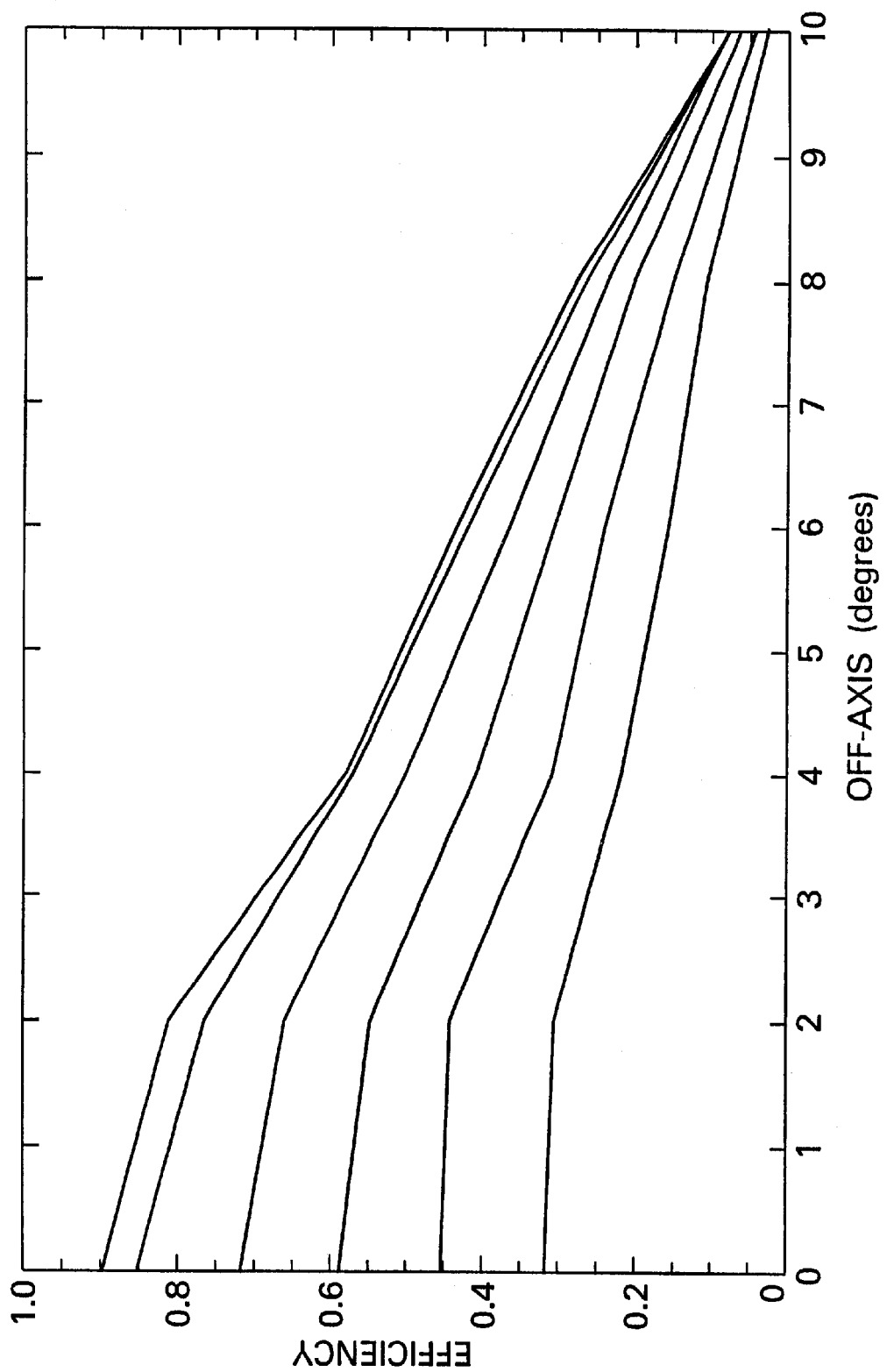
FIG. 15, on coordinates of efficiency and degrees, is a plot of off-axis efficiency for the 50× concentrator of the present invention.

Yet another improvement is achieved by shaping the walls in such a manner as to direct some extreme rays toward the solar cells by total internal reflection. A two-stage concentrator formed as described above can be designed to have optimized off-normal efficiency. FIG. 15 shows the performance of a truncated 50× concentrator for various $\alpha$ and $\beta$ angles ($\alpha$ angle, or transverse angle, is the angle between normal and the incident radiation in a plane perpendicular to the long axis of the 2-D/3-D configuration, while $\beta$, or easy angle, is the deviation from normal in a plane parallel to the long axis).

Table I lists the overall optical efficiency $\eta_{op}$ in percent, where $\alpha$ varies and $\beta$=0, while Table II lists the averaged optical efficiency $<\eta>$, in terms of range of integration in degrees, under the same conditions.

TABLE I

Overall Optical Efficiency.

| $\alpha$[°], $\beta$=0° | $\eta_{op}$ [%](±1%) |
|---|---|
| 0 | 89.0 |
| 1 | 85.2 |
| 2 | 81.8 |
| 3 | 69.7 |
| 4 | 56.8 |
| 5 | 50.1 |
| 6 | 42.6 |
| 7 | 35.2 |
| 8 | 27.8 |
| 9 | 17.0 |
| 10 | 8.0 |

TABLE II

Averaged Opitcal Efficiency.

| Range of Integration, ° | $<\eta>$, % |
|---|---|
| 0–1 | 87.8 |
| 0–2 | 85.8 |
| 0–3 | 81.8 |
| 0–4 | 76.8 |
| 0–5 | 72.3 |
| 0–6 | 68.1 |
| 0–7 | 64.0 |
| 0–8 | 60.0 |
| 0–9 | 55.7 |
| 0–10 | 50.3 |

The data, obtained by ray tracing for more than 10,000 rays per curve, as shown in FIG. 15, verify the excellent off-normal performance of the 50× concentrator of the present invention.

The concentrator cusp units 34 comprise a high thermal conductivity composite, such as K1100/cyanate ester composite, which also provides a lightweight, high strength and stiff structure. The lightweight composite has a specific gravity of 1.7 g/cm³, with walls that are 0.01 inch thick. The high thermal conductivity of the composite shell, which is obtained by layering the plies forming each layer in certain relative orientations during fabrication of the shell, allows effective radiation cooling from the back of the sub-array, the longitudinal conductivity is 563 W/mK. The composite shell has a high stiffness given by a tensile module of elasticity of 579 GPa.

As described above, the interior 34' of each concentrator cusp unit 34 is provided with an integral first surface mirror enhanced by dielectric coatings. As a specific example, aluminum or silver is employed as the mirror, while indium tin oxide (ITO), titania, and silica, which are transparent, are employed as the dielectric coating, which comprises a layer of each oxide. The purpose of the ITO layer is to prevent static buildup and subsequent arcing in space.

Each CCU 34 contains a localized bi-axial GRIN lens 44/cell string 46/substrate set 48. The concentrator optics is a Bezier approximation of an ideal CPC/transformer followed by the bi-axial GRIN lens 44.

Figure 16:
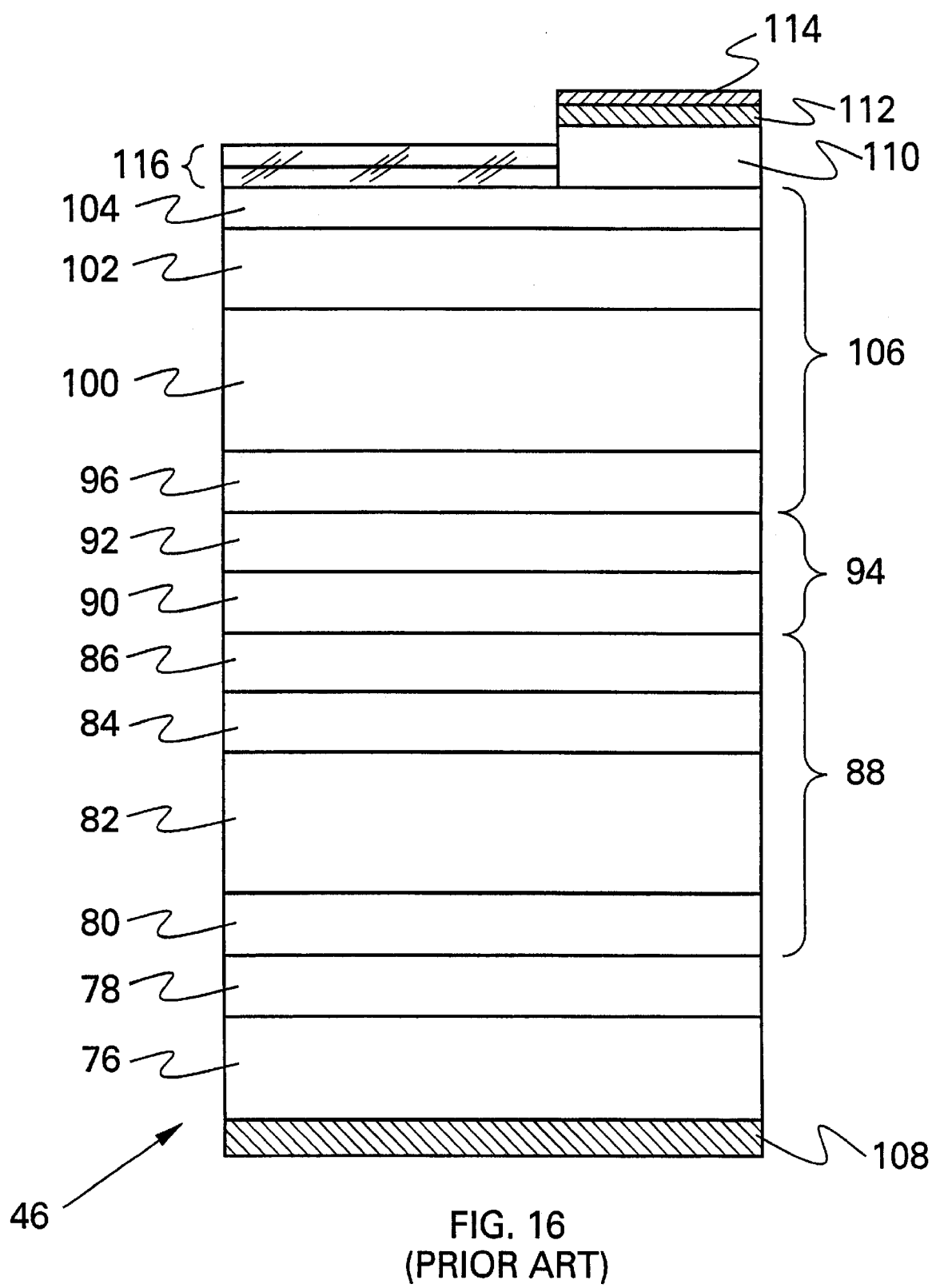
FIG. 16 is a cross-sectional view of a typical solar cell employed in the practice of the present invention.

The solar cell 46 employed in the practice of the present invention may comprise any of the solar cells commonly used in spacecraft applications. An example of such a solar cell 46 is depicted in FIG. 16, although the invention should not be considered as being limited to this specific example.

The solar cell 46 shown is one that is commonly referred to as a multijunction (MJ) GaInP/GaAs solar cell, comprising III-V compound semiconductor materials. The particular MJ cell used in the present invention was developed and optimized for 50× concentration by the Research Triangle Institute. The negligibly small chromatic aberration of the optical system allows effective use of MJ cells, as their performance is degraded by the presence of chromatic aberrations.

The solar cell 46 comprises a substrate 76, typically p$^+$-GaAs, doped with Zn to a dopant concentration of less than $1 \times 10^{19}$ cm$^{-3}$. On the top surface of the substrate 76 is formed a buffer layer 78 of p$^+$-GaAs, doped with Zn to a dopant concentration of about $7 \times 10^{18}$ cm$^{-3}$ and formed to a thickness of about 0.3 μm. On the buffer layer 78 is formed a first back surface field (BSF) layer 80 of p$^+$-InGaP, doped with Zn to a dopant concentration of about $2 \times 10^{18}$ cm$^{-3}$ and formed to a thickness of about 0.1 μm. The BSF layer 80 is introduced by diffusing excess amounts of dopants at the back surface and acts like a reflector that reflects the photoexcited carriers away and reduces their density there. Thus, surface recombination is reduced and the cell response improves. On the first BSF layer 80 is formed a base layer 82 of p-GaAs, doped with Zn to a dopant concentration of $1 \times 10^{17}$ cm$^{-3}$ and formed to a thickness of about 3.0 μm. On the base layer 82 is formed an emitter layer 84 of n$^+$-GaAs, doped with Si to a dopant concentration of about $2 \times 10^{18}$ cm$^{-3}$ and formed to a thickness of about 0.1 μm. On the emitter layer 84 is formed a first window layer 86 of n$^+$-AlInP, doped with Si to a dopant concentration of about $1 \times 10^{19}$ cm$^{-3}$ and formed to a thickness of about 0.05 μm. The window layer 86 is a layer of semiconductor material that is part of the solar cell design, which also acts like a layer of an anti-reflection coating. The base 82, the emitter 84, and the first window 86 comprise a GaAs bottom cell 88.

On the window layer 86 is formed a first tunnel diode layer 90 of n$^+$-InGaP, doped with Si to a dopant concentration of about $1 \times 10^{19}$ cm$^{-3}$ and formed to a thickness of about 0.015 μm. On the first tunnel diode layer 90 is formed a second tunnel diode layer 92 of p$^+$-InGaP, doped with Zn to a dopant concentration of about $6 \times 10^{18}$ cm$^{-3}$ and formed to a thickness of about 0.015 μm. The two tunnel diode layers 90 and 92 form an InGaP tunnel junction 94, or "interconnect", which interconnects the bottom GaAs cell 88 with the top GaAs cell (described below).

On the second tunnel diode layer 92 is formed a second BSF layer 96 of p$^+$-AlInP, doped with Zn to a dopant concentration of less than $1 \times 10^{18}$ cm$^{-3}$ and formed to a thickness of about 0.03 μm. On the second BSF layer 96 is formed a base layer 100 of p-InGaP, doped with Zn to a dopant concentration of about $1.5 \times 10^{17}$ cm$^{-3}$ and formed to a thickness of about 0.55 μm. On the base layer 100 is formed an emitter layer 102 of n$^+$-InGaP, doped with Si to a dopant concentration of about $2 \times 10^{18}$ cm$^{-3}$ and formed to a thickness of about 0.05 μm. On the emitter layer 102 is formed a second window layer 104 of n$^+$-AlInP, doped with Si to a dopant concentration of less than $2 \times 10^{18}$ cm$^{-3}$ and formed to a thickness of about 0.03 μm. The base layer 100, the emitter layer 102, and the window layer 104 comprise an InGaP top cell 106.

The substrate 76 is provided with a metallic layer 108, typically gold, for a first contact to the solar cell 46. A portion of the window layer 104 is provided with an n$^+$-GaAs cap layer 110, having a thickness of about 0.3 μm.

The cap layer 110 is contacted with a conventional metal contact layer 112 comprising Au—Ge/Ni/Au, which in turn is contacted with an Au layer 114, which provides a second contact to the solar cell 46. The remainder of the window layer 104 is covered with a two-layer anti-reflection coating 116, comprising MgF$_2$/ZnS. The MgF$_2$ layer is formed on top of the ZnS layer. MgF$_2$ has a low refractive index (1.38) and is effective as a lens anti-reflective coating. Layers of MgF$_2$ only a few molecules thick form a coating that is robust and stable.

Another example of a high efficiency MJ solar cell is disclosed and claimed in U.S. Pat. No. 5,405,453, issued to F. F. Ho et al.

Figure 17B:
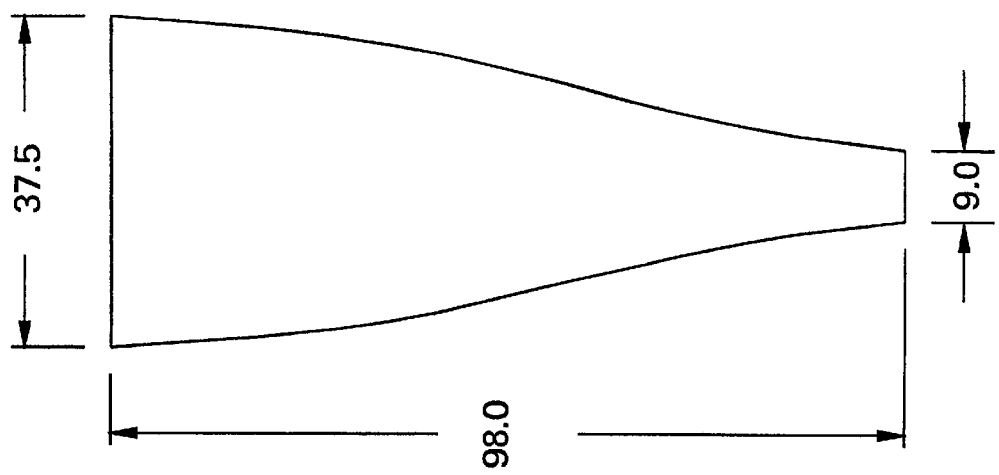
FIGS. 17a and 17b are similar to FIGS. 9a and 9b, respectively, but illustrating a two-stage concentrator in which the refractive optics of the second stage have been replaced with a reflector.
Figure 17A:
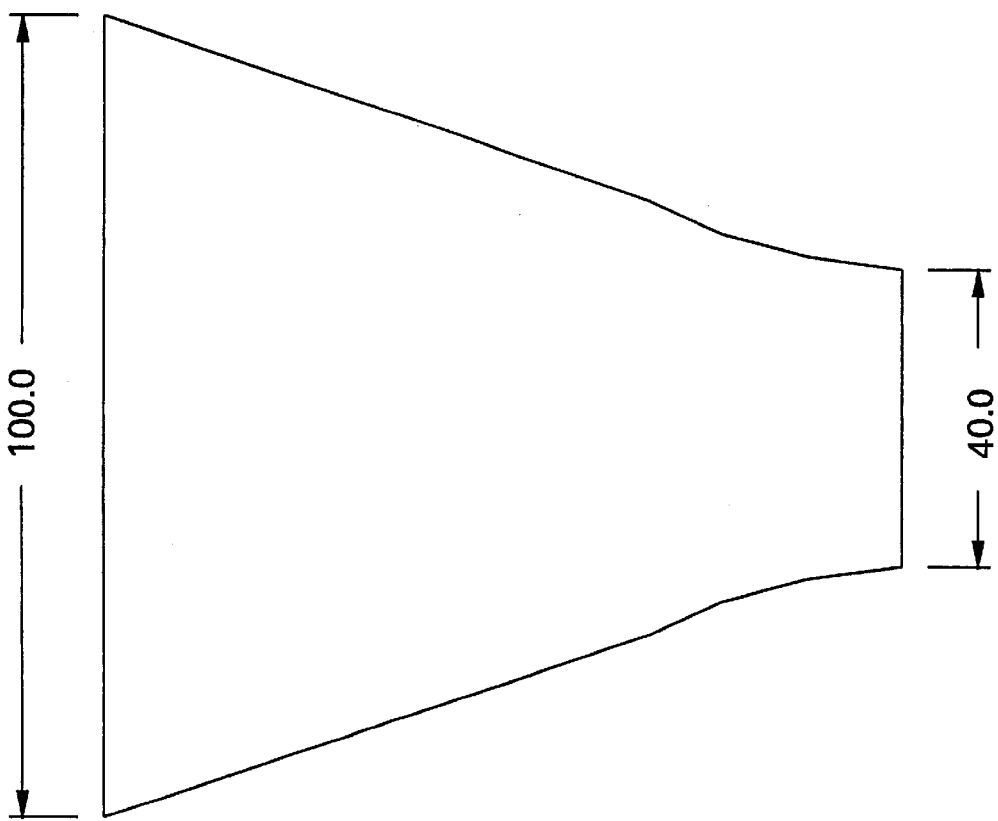
Figure 18:
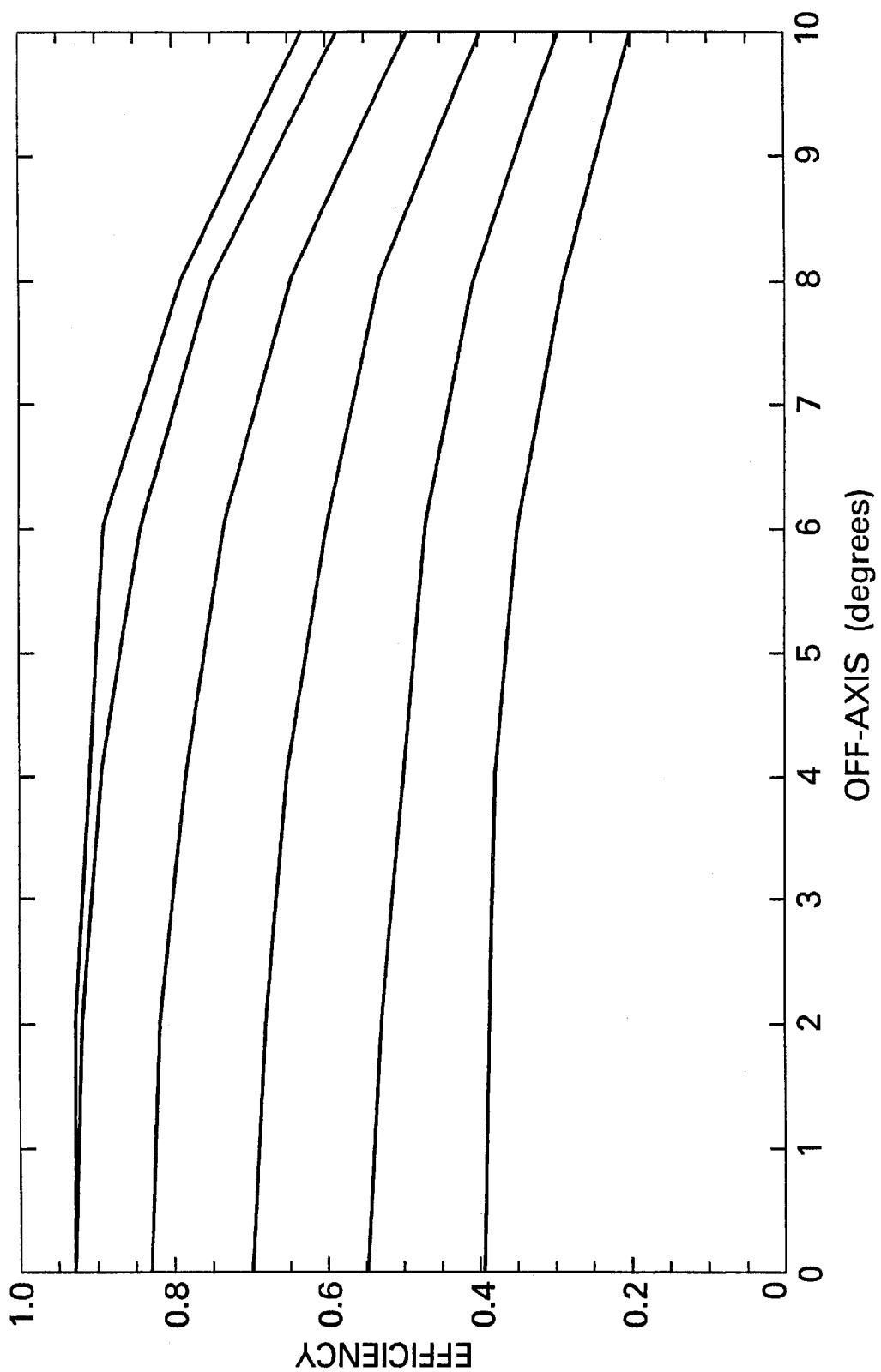
FIG. 18, on coordinates of efficiency and degrees, is a plot similar to that of FIG. 15, but depicting the off-axis efficiency for the concentrator of FIGS. 17a and 17b.

In an alternate embodiment, shown in FIGS. 17a and 17b, a two-stage concentrator is shown, but without the bi-axial lens. In this embodiment, the concentrator cusp 34 has the same shape as described above, and the entire interior surface 34' is provided with the integral mirrored surface. FIG. 18 shows the performance of this alternate embodiment for various α and β angles.

Figure 19:
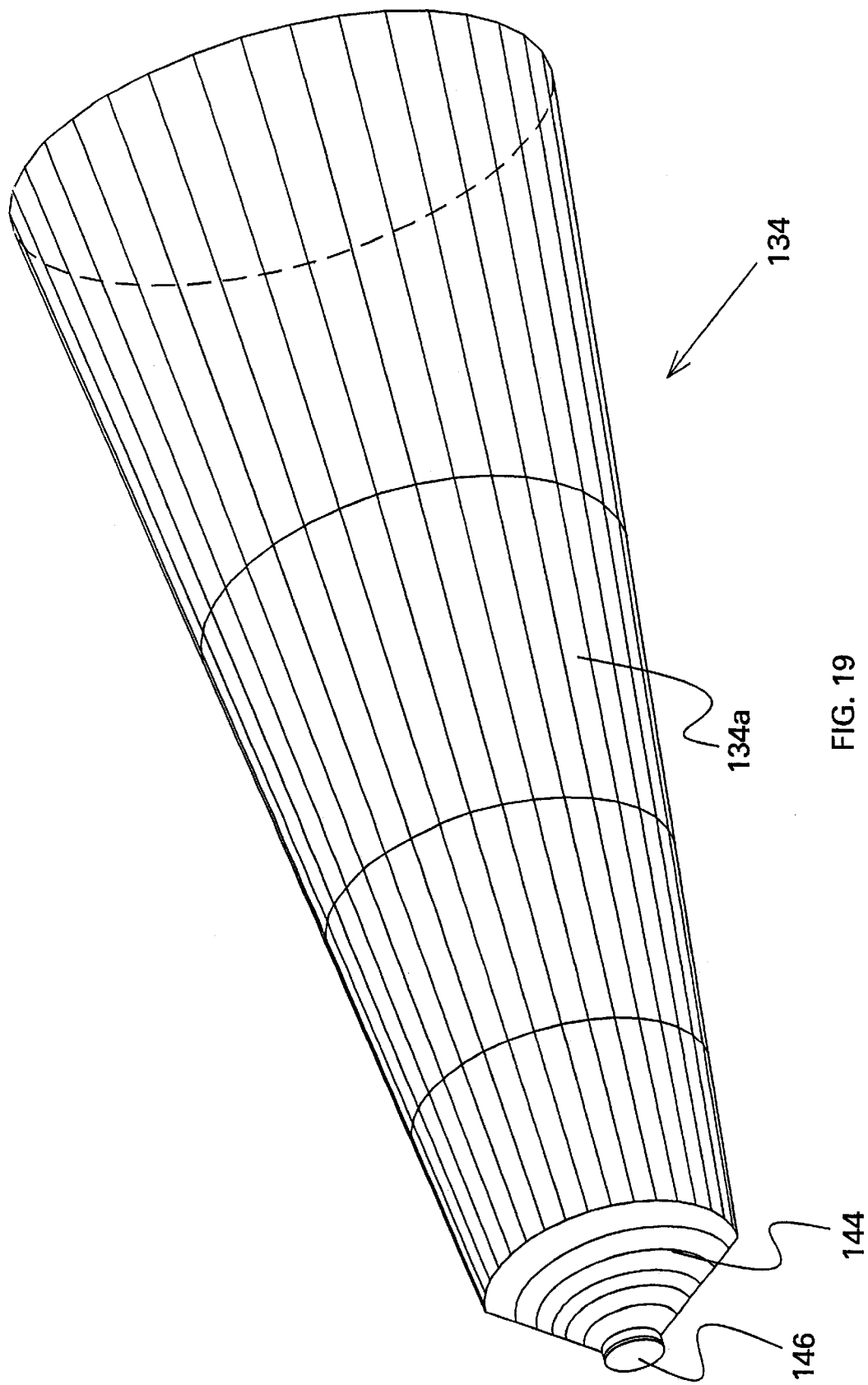
FIG. 19 is a perspective view of a two-stage concentrator, comprising a conical first stage and a radial gradient refractive index lens, in combination with a disk-shaped solar cell.

In yet another alternate embodiment, a radial GRIN lens 144 may be combined with a conical or polygonal (in cross-section) cusp 134 to form a solar concentrator. A radial GRIN lens is one having isoindex planes concentric about a central point. The side walls 134a of the cusp 134 may be conical as shown or may be polygonal, such as hexagonal, for example. The solar concentrator is depicted in FIG. 19 in conjunction with a solar cell 146, which is disk-shaped. The off-angle performance of this combination is excellent, with over 90% of the rays incident on a 5 mm detector out to an angle α of about 7°, and dropping off slightly out to an angle of 10°.

As with the primary embodiment, sub-arrays of such cusps 134 can be fabricated, which nest for stowage. Interconnected between solar cells 146 may be done as described above, with flexible circuit traces outside each cusp 134.

In summary, the concentrator of the present invention includes the above-described Bezier surfaces in tandem with the bi-axial lens; this combination not only shortens the focal length (small f-number less than 1), but also increases the off-angle performance of the concentrator by (1) use of the bending power of the gradient index of refraction in the bi-axial lens and (2) the total internal reflection by the walls of the bi-axial element. The advantages of the present invention, briefly, are (1) high concentrations with f-numbers about 1, hence very low profile;

(2) high performance with low weight (good specific power);

(3) high stowage power density with nesting capability;

(4) excellent off-angle performance;

(5) negligible chromatic aberration at high concentrations;

(6) ability to use conventional flat PV panel mounting and deployment technology; and (7) high stiffness and excellent thermal management with advanced composite system.

EXAMPLES

A sub-array 32 of two-stage concentrators of the invention, such as depicted in FIG. 2, was constructed, comprising an array of 2×4 concentrators. Each concentrator cusp 34 was 100 mm in length and 37.5 mm in width (at its entrance), and, with Bezier curves, was reduced to 40 mm in length and 16 mm in width (at the top of the bi-axial lens 44). The exit length of the bi-axial lens 44 was 30 mm and the exit width was 2.5 mm. The overall height of the concentrator cusp was 98 mm. The dimensions of the overall sub-array 32 was 203.1 mm×154 mm.

The inside surface 34' of the concentrator cusp 34 was provided with an aluminum coating 100 nm thick, which was covered with a silica coating 117 nm thick. An ITO layer 84 nm thick covered the silica coating. The average reflectance of the aluminum layer was determined to be about 93% over the wavelength range of λ=350 nm and λ=900 nm. Alternatively, a silver coating, 50 nm thick, coated with a silica coating 66 nm thick, in turn coated with an ITO layer 44 nm thick was used. The average reflectance of the silver layer was determined to be about 97.5% over the wavelength range of λ=370 nm and λ=900 nm.

The top surface of the bi-axial lens 44 was coated with a $MgF_2$ anti-reflective coating, having an index of refraction of 1.38. The bi-axial lens 44 had a quadratic index of refraction profile, ranging from an index of refraction of 1.68 at the low index surface to an index of refraction of 1.84 at the high index surface, to provide a Δn of 0.16 for each sub-element 44a, 44b. The present inventor developed a particular quadratic profile of the form $$n = n_{max}\left(1 - \frac{\Delta n \cdot x^2}{n_{max} \cdot t^2}\right)$$

where $n_{max}$=1.84, Δn=0.15, and t is the thickness, 8 mm.

The bi-axial lens 44 was obtained from Lightpath Technologies, Inc. (Albuquerque, N. Mex.), who manufactured the lens according to this profile. The refractive index distribution for this device exhibited a very close index profile between the pre-calculated profile and the actual obtained profile; the validity of fit was $R^2$=0.995. $R^2$ is known as the coefficient of determination and has an upper limit of 1. This is a measure of how closely the measured refractive index profile agrees with the predicted refractive index profile as a function of depth in glass. The upper limit of 1 corresponds to the situation where all predicted index values lie on the regression line obtained by the least square fit method.

The solar cell 46 was mounted on the ceramic substrate 48 and comprised a $GaInP_2$/GaAs multi-junction cell having a top refractive index of 3.12. A ZnS anti-reflective coating, having a refractive index of 2.35, was provided on the top surface. The coated solar cell 46 was secured to the bottom of the bi-axial lens 44 by an optical cement having a refractive index of 1.58. The bi-axial lens 44 was also structurally secured against the sidewalls 34' of the concentrator cusp 34.

In an analytical simulation of the foregoing two-stage concentrator 32 of the invention, a number of findings were determined, involving a computer simulation using ray tracing methods. The software used for this study was ASAP, Version 5.1, from Breault Research, Inc. (Tucson, Ariz.). First, overall optical efficiency was 89% at normal incidence of solar radiation. Second, the overall optical efficiency was almost constant, dropping off only slightly from 89% at 0.4 μm to 0.88% at 1.5 μm in a monotonic fashion, indicating negligible effect of chromatic aberration on the optical efficiency.

The state of the art with dual junction $GaInP_2$/GaAs cell is approaching 27% efficiency at 25° C. and one sun AM0 illumination. At higher concentrations, the cell efficiency increases slightly. The concentrator of the present invention is designed to operate at 80° C. This increase in temperature reduces the efficiency by about the same amount; thus, it is expected that the same cell performance, i.e., 27% efficiency at 25° C. will be obtained. Calculations show that the 50× GRIN concentrator of the present invention can reach 45 Watts/Kg if the GRIN lens transmission characteristics match the cell spectral response fully, where the concentration ratio is given by the ratio of the illuminated cell area to the total module aperture area.

INDUSTRIAL APPLICABILITY

The two-stage solar concentrator of the present invention is expected to find use in providing electrical power from solar energy in a multitude of space-related applications, including low earth orbit (LEO) telecommunications satellites, mid earth orbit (MEO) military and research satellites, and a large variety of geosynchronous earth orbit (GEO) applications. Unlike flat plate rigid or flexible PV panels, the concentrator of the present invention is far more applicable for missions that require radiation-hardened systems or high concentration of solar radiation for deep space missions.

Thus, there has been disclosed a concentrator for concentrating solar energy onto a solar cell. It will be readily apparent to those skilled in this art that various changes and modifications of an obvious nature may be made, and all such changes and modifications are considered to fall within the scope of the present invention, as defined by the appended claims.

What is claimed is:

1. A space-based concentrator for concentrating solar radiation onto a solar cell, said concentrator comprising:
   (a) a first stage, said first stage comprising a rectilinear entrance, a rectilinear exit, and four sides joining said entrance and said exit, said four sides including inner mirrored surfaces between said entrance and said exit, said inner mirror surfaces configured to accept said solar radiation from said entrance and to direct said solar radiation to said exit; and
   (b) a second stage, said second stage comprising mirrored inner surfaces, said second stage having a rectilinear entrance, a rectilinear exit, and four sides joining said entrance and said exit, said entrance abutting said exit of said first stage, and said exit of said second stage adapted to receive said solar cell,
wherein two of four sides of each of said first stage and said second stage are longer than the other two of said sides of each of said first stage and said second stage, wherein at least said two longer sides comprise optimized Bezier surfaces which approximate a parabolic surface, and wherein said concentrator is configured to nest with other concentrators comprising said first and second stages.

2. The concentrator of claim 1 wherein said cusp comprises a composite shell that evidences lightweight, high stiffness, and high thermal conductivity properties.

3. The concentrator of claim 1 wherein said cusp contains flexible electronic circuitry strips on its outer surfaces which conforms to said surfaces for permitting nesting of cusps.

4. The concentrator of claim 1 wherein said mirrored surfaces comprise aluminum or silver.

5. The concentrator of claim 4 wherein said mirrored surfaces are protected with at least one dielectric coating.

6. The concentrator of claim 5 wherein said mirrored surfaces are protected with at least one coating selected from the group consisting of silica and titania, coated with indium tin oxide.

7. In combination, a solar cell and a space-based concentrator for concentrating solar radiation onto said solar cell, said concentrator comprising:

(a) a first stage, said first stage comprising a rectilinear entrance, a rectilinear exit, and four sides joining said entrance and said exit, said four sides including inner mirrored surfaces between said entrance and said exit, said inner mirror surfaces configured to accept said solar radiation from said entrance and to direct said solar radiation to said exit; and (b) a second stage, said second stage comprising mirrored inner surfaces, said second stage having a rectilinear entrance, a rectilinear exit, and four sides joining said entrance and said exit, said entrance abutting said exit of said first stage, and said exit of said second stage adapted to receive said solar cell, said solar cell secured to said exit of said second stage, wherein two of said four sides of each of said first stage and said second stage are longer than the other two of said sides of each of said first stage and said second stage, wherein at least said two longer sides comprise optimized Bezier surfaces which approximate a parabolic surface, and wherein said concentrator is configured to nest with other concentrators comprising said first and second stages.

8. The combination of claim 7 wherein said cusp comprises a composite shell that evidences lightweight, high stiffness, and high thermal conductivity properties.

9. The combination of claim 7 wherein said cusp contains flexible electronic circuitry strips on its outer surfaces which conforms to said surfaces for permitting nesting of cusps and for electrically connecting to said solar cell.

10. The combination of claim 7 wherein said mirrored surfaces comprise aluminum or silver.

11. The combination of claim 10 wherein said mirrored surfaces are protected with at least one dielectric coating.

12. The combination of claim 11 wherein said mirrored surfaces are protected with at least one coating selected from the group consisting of silica and titania, coated with indium tin oxide.

13. In combination, a panel array comprising a plurality of solar cells and a plurality of space-based concentrators, each concentrator for concentrating solar radiation onto one said solar cell, each said concentrator comprising:

(a) a first stage, said first stage comprising a rectilinear entrance, a rectilinear exit, and four sides joining said entrance and said exit, said four sides including inner mirrored surfaces between said entrance and said exit, said inner mirror surfaces configured to accept said solar radiation from said entrance and to direct said solar radiation to said exit; and (b) a second stage, said second stage comprising mirrored inner surfaces, said second stage having a rectilinear entrance, a rectilinear exit, and four sides joining said entrance and said exit, said entrance abutting said exit of said first stage, and said exit of said second stage adapted to receive said solar cell, said solar cell secured to said exit of said second stage, wherein two of said four sides of each of said first stage and said second stage are longer than the other two of said sides of each of said first stage and said second stage, wherein at least said two longer sides comprise optimized Bezier surfaces which approximate a parabolic surface, and wherein said concentrator is configured to nest with other concentrators comprising said first and second stages.

14. The combination of claim 13 wherein said cusp comprises a composite shell that evidences lightweight, high stiffness, and high thermal conductivity properties.

15. The combination of claim 13 wherein said cusp contains flexible electronic circuitry strips on its outer surfaces which conforms to said surfaces for permitting nesting of cusps and for electrically connecting to said solar cell.

16. The combination of claim 13 wherein said mirrored surfaces comprise aluminum or silver.

17. The combination of claim 16 wherein said mirrored surfaces are protected with at least one dielectric coating.

* * * * *